United States Patent
Mori et al.

(10) Patent No.: US 9,224,487 B2
(45) Date of Patent: Dec. 29, 2015

(54) SEMICONDUCTOR MEMORY READ AND WRITE ACCESS

(71) Applicant: Spansion LLC, Sunnyvale, CA (US)

(72) Inventors: Kaoru Mori, Yokohama (JP); Toshiya Uchida, Yokohama (JP)

(73) Assignee: Cypress Semiconductor Corporation, San Jose, CA (US)

( * ) Notice: Subject to any disclaimer, the term of this patent is extended or adjusted under 35 U.S.C. 154(b) by 4 days.

(21) Appl. No.: 13/749,246

(22) Filed: Jan. 24, 2013

(65) Prior Publication Data

US 2013/0135940 A1    May 30, 2013

Related U.S. Application Data

(62) Division of application No. 13/020,636, filed on Feb. 3, 2011, now Pat. No. 8,385,128.

(30) Foreign Application Priority Data

Apr. 16, 2010    (JP) .................................. 2010-095164

(51) Int. Cl.
    *G11C 11/06*    (2006.01)
    *G11C 16/26*    (2006.01)
    *G11C 7/18*    (2006.01)
    *G11C 7/22*    (2006.01)
    (Continued)

(52) U.S. Cl.
    CPC *G11C 16/26* (2013.01); *G11C 7/18* (2013.01); *G11C 7/227* (2013.01); *G11C 16/24* (2013.01); *G11C 16/32* (2013.01)

(58) Field of Classification Search
    USPC .............. 365/185.17, 185.21, 185.25, 185.28
    See application file for complete search history.

(56) References Cited

U.S. PATENT DOCUMENTS

| 5,007,024 A | 4/1991 | Tanaka et al. |
| 5,781,489 A | 7/1998 | Okamoto |

(Continued)

FOREIGN PATENT DOCUMENTS

| JP | 63-239693 A | 10/1988 |
| JP | 06-036586 A | 2/1994 |

(Continued)

OTHER PUBLICATIONS

Notice of Reasons for Rejection (with English language translation) directed to related Japanese Patent Application No. 2014-095405, mailed Jan. 19, 2015; 5 pages.

(Continued)

*Primary Examiner* — Hoai V Ho

(57) ABSTRACT

A semiconductor memory includes a sense amplifier which operates in response to activation of a sense amplifier enable signal and determines logic held in a nonvolatile memory cell according to a voltage of a bit line, the voltage varying with a cell current flowing through a real cell transistor, a replica cell transistor coupled in series between a first node and a ground line, and a timing generation unit. The timing generation unit activates the sense amplifier enable signal when the first node coupled to the ground line via the replica cell transistor changes from a high level to a low level. The replica cell transistor includes a control gate receiving a constant voltage and a floating gate coupled to the control gate. Thus, the activation timing of the sense amplifier can be optimally set in accordance with the electric characteristic of the memory cell.

8 Claims, 16 Drawing Sheets

(51) Int. Cl.
*G11C 16/24* (2006.01)
*G11C 16/32* (2006.01)

(56) References Cited

U.S. PATENT DOCUMENTS

| | | | |
|---|---|---|---|
| 5,835,408 A | 11/1998 | Akaogi et al. | |
| 5,978,264 A | 11/1999 | Onakado et al. | |
| 6,094,392 A | 7/2000 | Utsugi et al. | |
| 6,330,189 B1 | 12/2001 | Sakui et al. | |
| 6,377,495 B1 | 4/2002 | Lorenz | |
| 6,380,636 B1 | 4/2002 | Tatsukawa et al. | |
| 6,738,296 B2 | 5/2004 | Sung et al. | |
| 6,795,346 B2 | 9/2004 | Otani et al. | |
| 6,822,907 B2 | 11/2004 | Maruyama et al. | |
| 6,829,154 B1 | 12/2004 | Kang | |
| 6,865,705 B2 | 3/2005 | Tomizawa et al. | |
| 6,937,535 B2 | 8/2005 | Ahn et al. | |
| 6,975,528 B2 | 12/2005 | Do | |
| 6,982,914 B2 | 1/2006 | Ohtsuki et al. | |
| 7,016,230 B2 | 3/2006 | Hosono | |
| 7,123,510 B2 | 10/2006 | Kojima et al. | |
| 7,136,318 B2 | 11/2006 | Ohtsuki et al. | |
| 7,137,022 B2 | 11/2006 | Ishikawa | |
| 7,161,835 B2 | 1/2007 | Shiga | |
| 7,180,779 B2 | 2/2007 | Telecco et al. | |
| 7,180,788 B2 | 2/2007 | Kanamitsu et al. | |
| 7,187,599 B2 | 3/2007 | Schnell et al. | |
| 7,209,377 B2 | 4/2007 | Ozeki | |
| 7,212,430 B2 | 5/2007 | Fukushi et | |
| 7,248,523 B2 | 7/2007 | Ohtsuki et al. | |
| 7,251,165 B2 | 7/2007 | Taito et al. | |
| 7,263,002 B2 | 8/2007 | Omoto | |
| 7,280,402 B2 | 10/2007 | Kim | |
| 7,312,503 B2 | 12/2007 | Umezawa et al. | |
| 7,405,959 B2 | 7/2008 | Koide et al. | |
| 7,415,568 B2 | 8/2008 | Kawabata et al. | |
| 7,433,230 B2 | 10/2008 | Kono et al. | |
| 7,440,330 B2 | 10/2008 | Noichi | |
| 7,639,559 B2 | 12/2009 | Kurata et al. | |
| 7,675,784 B2 | 3/2010 | Kaneda | |
| 7,697,358 B2 | 4/2010 | Kajigaya | |
| 7,701,794 B2 | 4/2010 | Kajigaya | |
| 7,830,738 B2 | 11/2010 | Kajigaya | |
| 7,839,694 B2 | 11/2010 | Joe et al. | |
| 8,385,128 B2 | 2/2013 | Mori et al. | |
| 8,635,397 B2 | 1/2014 | Kodama | |
| 2004/0141394 A1 | 7/2004 | Nishida et al. | |
| 2005/0128838 A1* | 6/2005 | Otani et al. | 365/203 |
| 2007/0064479 A1 | 3/2007 | Yamada | |
| 2007/0153618 A1 | 7/2007 | Fujito et al. | |
| 2007/0195601 A1* | 8/2007 | Omoto | 365/185.13 |
| 2008/0008007 A1 | 1/2008 | Mori | |
| 2009/0303798 A1 | 12/2009 | Morton et al. | |
| 2010/0050403 A1 | 3/2010 | Kim | |
| 2010/0177580 A1* | 7/2010 | Komatsu et al. | 365/203 |
| 2011/0255347 A1 | 10/2011 | Mori et al. | |

FOREIGN PATENT DOCUMENTS

| | | |
|---|---|---|
| JP | 09-293389 A | 11/1997 |
| JP | 10-80288 A | 3/1998 |
| JP | 10-162594 A | 6/1998 |
| JP | 10-275489 A | 10/1998 |
| JP | 2000-123574 A | 4/2000 |
| JP | 2000-275309 A | 10/2000 |
| JP | 2001-28427 A | 1/2001 |
| JP | 2001-52487 A | 2/2001 |
| JP | 2001-160297 A | 6/2001 |
| JP | 2001-297592 A | 10/2001 |
| JP | 2001-325797 A | 11/2001 |
| JP | 2002-32995 A | 1/2002 |
| JP | 2002-133888 A | 5/2002 |
| JP | 2002-150781 A | 5/2002 |
| JP | 2002-367390 A | 12/2002 |
| JP | 2003-036203 A | 2/2003 |
| JP | 2003-157689 A | 5/2003 |
| JP | 2003-242793 A | 8/2003 |
| JP | 2003-242799 A | 8/2003 |
| JP | 2003-331582 A | 11/2003 |
| JP | 2004-55073 A | 2/2004 |
| JP | 2004-145999 A | 5/2004 |
| JP | 2004-158111 A | 6/2004 |
| JP | 2004-164700 A | 6/2004 |
| JP | 2004-164815 A | 6/2004 |
| JP | 2004-219097 A | 8/2004 |
| JP | 2004-241110 A | 8/2004 |
| JP | 2004-318941 A | 11/2004 |
| JP | 2004-326965 A | 11/2004 |
| JP | 2005-25917 A | 1/2005 |
| JP | 2005-116102 A | 4/2005 |
| JP | 2005-116145 A | 4/2005 |
| JP | 2005-182871 A | 7/2005 |
| JP | 2005-209914 A | 8/2005 |
| JP | 2005-228446 A | 8/2005 |
| JP | 2005-317110 A | 11/2005 |
| JP | 2006-12240 A | 1/2006 |
| JP | 2006-24263 A | 1/2006 |
| JP | 2006-79692 A | 3/2006 |
| JP | 2006-93748 A | 4/2006 |
| JP | 2006-190395 A | 7/2006 |
| JP | 2006-252658 A | 9/2006 |
| JP | 2006-309870 A | 11/2006 |
| JP | 2006-331587 A | 12/2006 |
| JP | 2007-37097 A | 2/2007 |
| JP | 2007-80338 A | 3/2007 |
| JP | 2007-087512 A | 4/2007 |
| JP | 2007-157259 A | 6/2007 |
| JP | 2007-164865 A | 6/2007 |
| JP | 2007-250092 A | 9/2007 |
| JP | 2008-052906 A | 3/2008 |
| JP | 2008-140431 A | 6/2008 |
| JP | 2008-262632 A | 10/2008 |
| JP | 2008-282459 A | 11/2008 |
| JP | 2008-294310 A | 12/2008 |
| JP | 2009-502001 A | 1/2009 |
| JP | 2009-48755 A | 3/2009 |
| JP | 2009-140605 A | 6/2009 |
| JP | 2009-259397 A | 11/2009 |
| JP | 2011-227659 A | 11/2011 |
| WO | WO 02/082460 A1 | 10/2002 |
| WO | WO 2006/011213 A1 | 2/2006 |

OTHER PUBLICATIONS

Fujitsu Semiconductor, "Fujitsu Develops New NOR Flash Memory Macro", Yokohama, Japan; dated Mar. 24, 2010; 2 pages.

USPTO Notice of Allowance for U.S. Appl. No. 13/020,636 dated Nov. 16, 2012; 8 pages.

* cited by examiner

SEMICONDUCTOR MEMORY READ AND WRITE ACCESS

CROSS-REFERENCED TO RELATED APPLICATION

This is a divisional application of U.S. patent application Ser. No. 13/020,636 filed Jan. 3, 2011, which claims priority of Japanese Patent Application No. 2010-095164, filed on Apr. 16, 2010, the disclosure of the prior applications are hereby incorporated in their entirety by reference.

FIELD

The present embodiments relate to a nonvolatile semiconductor memory.

BACKGROUND

In a nonvolatile semiconductor memory, such as a flash memory, it is known that a plurality of local bit lines is coupled to a common global bit line and each of the local bit lines is coupled to memory cells. Related arts are discussed in International Publication Pamphlet No. WO2002/082460, and Japanese Laid-open Patent Publication No. 2003-036203 and No. 2004-318941. In this type of semiconductor memory, a sense amplifier is coupled to the local bit line and the logic of data held in the memory cell is read without using a reference memory cell. For example, in a read operation, after precharging the local bit line, the voltage of the local bit line is changed by a cell current flowing through the memory cell to be accessed, and then data is read by detecting a change in the voltage using the sense amplifier. Related arts are discussed in Japanese Laid-open Patent Publication No. Hei10-275489 and No. 2001-160297.

Also, a nonvolatile semiconductor memory is known, wherein the activation timing of a sense amplifier in a read operation is varied according to an operation mode. A related art is discussed in Japanese Laid-open Patent Publication No. 2002-367390. A nonvolatile semiconductor memory is known, wherein in a read operation, the voltage of a reference bit line is changed by a current flowing through a reference memory cell and an activation timing of a sense amplifier is generated. A related art is discussed in Japanese Laid-open Patent Publication No. 2007-87512.

Moreover, a nonvolatile semiconductor memory is known, wherein a switch for coupling each of the bit lines to a ground line is provided and wherein an adjacent bit line of the bit line onto which data is read from a memory cell is coupled to the ground line via the switch. Related arts are discussed in Japanese Laid-open Patent Publication Nos. Hei9-293389, 2001-325797, and 2004-158111.

When the voltage of the bit line is changed by the cell current flowing through the memory cell and data is read, the activation timing of the sense amplifier needs to be set in accordance with the electric characteristic of the memory cell.

SUMMARY

According to an aspect of the present embodiments, a semiconductor memory includes at least one of nonvolatile memory cells including a real cell transistor including a first control gate and a first floating gate, a word line coupled to the first control gate, a bit line coupled to the real cell transistor and precharged before a read operation, a sense amplifier operating, in the read operation, in response to activation of a sense amplifier enable signal and determining logic held in each of the nonvolatile memory cells according to a voltage of the bit line, the voltage varying with a cell current flowing through the real cell transistor, and a timing generation unit including a replica cell transistor and a switch transistor coupled in series between a first node and a ground line, and activating the sense amplifier enable signal when the first node, which is coupled to the ground line via the replica cell transistor and the switch transistor at the time of the read operation, changes from a high level to a low level, in which the replica cell transistor includes a second control gate receiving a constant voltage and a second floating gate coupled to the second control gate, and in which the switch transistor is turned on upon receipt of an operation enable signal at a gate of the switch transistor, the operation enable signal being activated at the time of the read operation.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Figure 1:
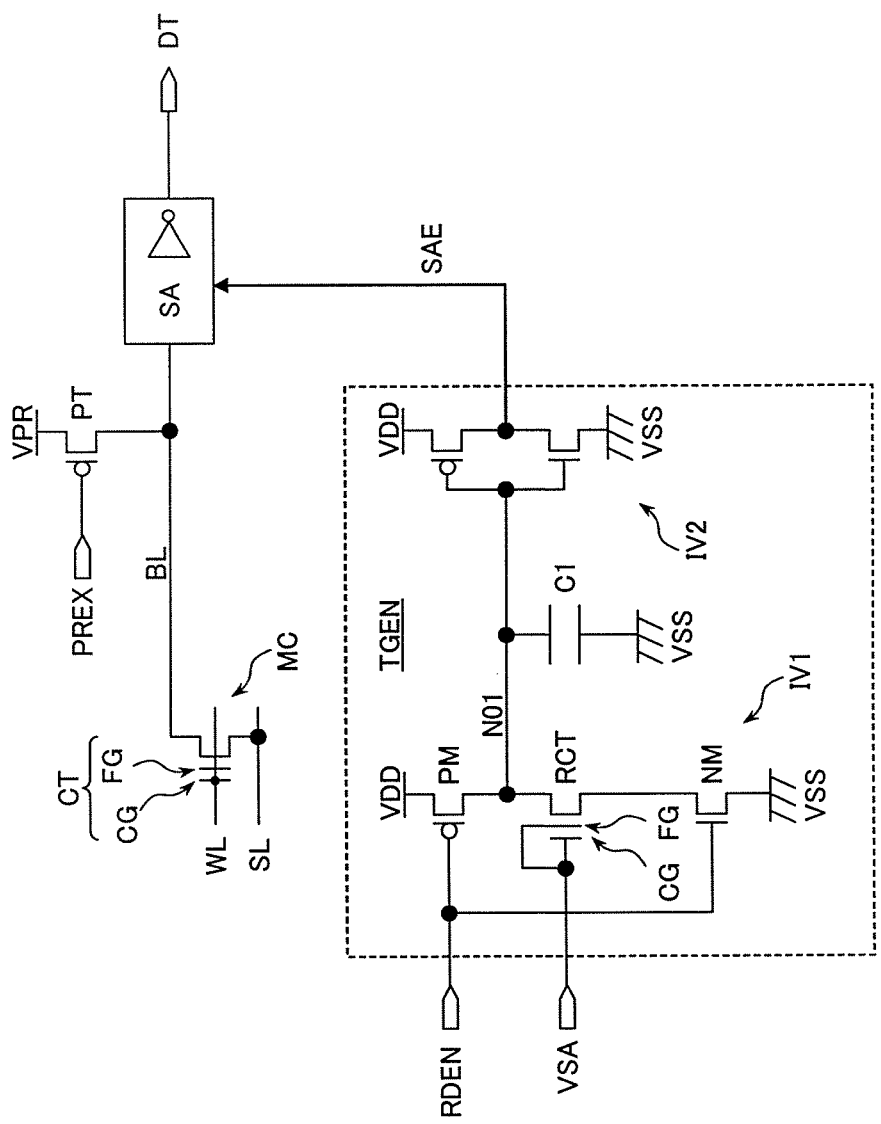
FIG. 1 illustrates an example of a semiconductor memory in one embodiment.

Hereinafter, embodiments will be described using the accompanying drawings. A double square mark in the accompanying drawings indicates an external terminal. The external terminal is, for example, a pad on a semiconductor chip or a lead of a package in which a semiconductor chip is mounted. The same reference numeral as the terminal name is used for a signal supplied via the external terminal.

FIG. 1 illustrates an example of a semiconductor memory MEM in one embodiment. For example, the semiconductor memory MEM is a nonvolatile semiconductor memory, such as a flash memory. The semiconductor memory MEM includes a memory cell MC, a precharge transistor PT, a sense amplifier SA, and a timing generation unit TGEN. The memory cell MC includes a real cell transistor CT having a floating gate FG and a control gate CG. The control gate CG is coupled to a word line WL. For example, a drain of the real cell transistor CT is coupled to a bit line BL, and a source of the real cell transistor CT is coupled to a source line SL.

Figure 2:
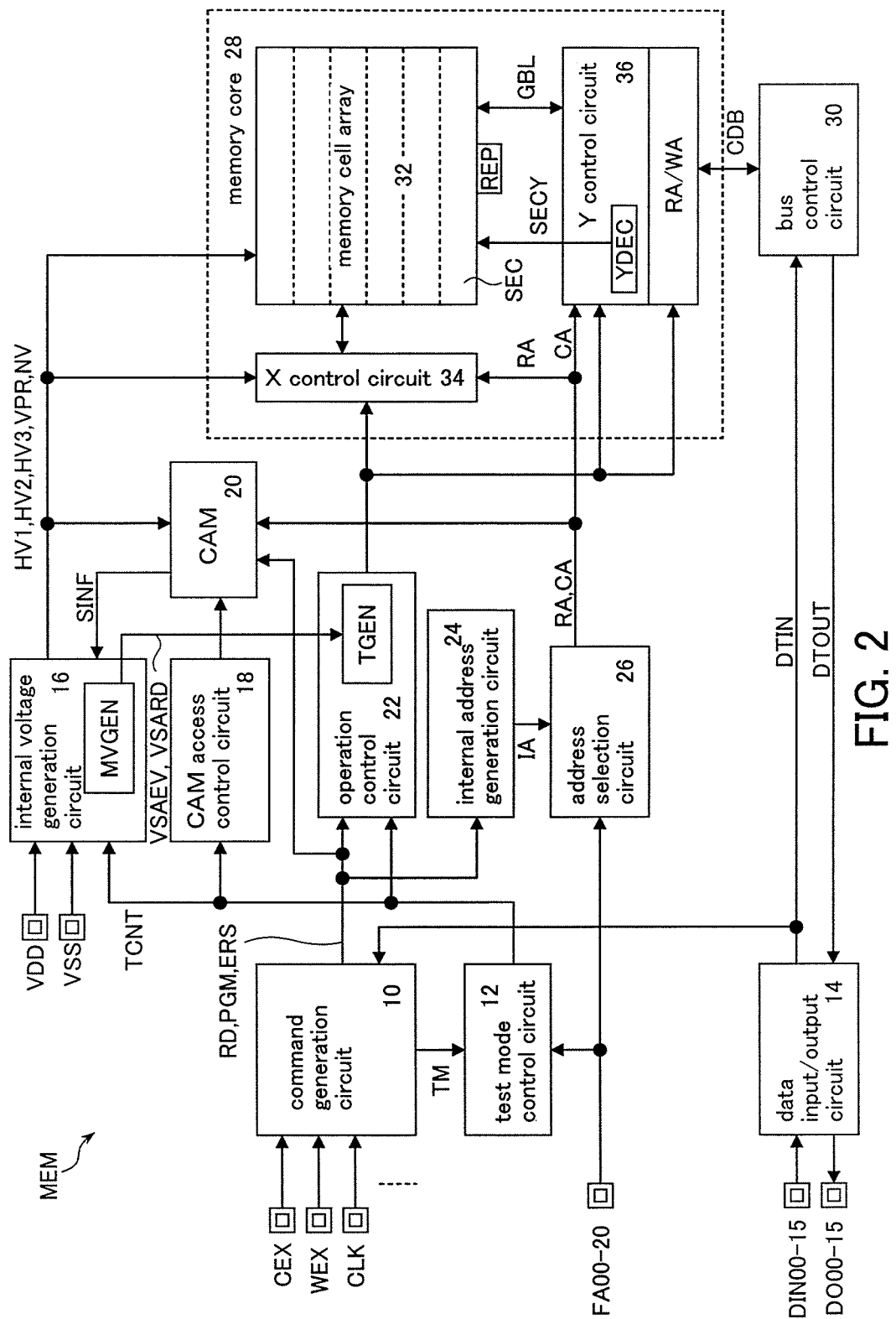
FIG. 2 illustrates an example of a semiconductor memory in another embodiment.

Note that, as illustrated in FIG. 2, the semiconductor memory MEM may include a memory cell array 32. In this case, the sense amplifier SA is formed corresponding to each of a plurality of the bit lines BL. When the bit line BL has a hierarchical structure, the sense amplifier SA may be formed for each global bit line which is formed corresponding to a predetermined number of the local bit lines.

The precharge transistor PT is, for example, a pMOS transistor, and is turned on when it receives at its gate a precharge signal PREX of a low level, and supplies to the bit line BL a precharge voltage VPR lower than a power supply voltage VDD. For example, the power supply voltage VDD is 1.2 V, and the precharge voltage VPR is 0.9 V. In the read operation, the sense amplifier SA operates in response to the activation of a sense amplifier enable signal SAE, and determines the logic held in the memory cell MC according to the voltage of the bit line BL. The sense amplifier SA outputs a data signal DT indicative of the determined logic.

The timing generation unit TGEN includes CMOS inverters IV1, IV2 coupled in series and a capacitor C1 coupled between an output node N01 of the CMOS inverter IV1 and a ground line VSS. The input of the CMOS inverter IV1 receives an operation enable signal RDEN which is activated to a high level at the time of the read operation. The CMOS inverter IV1 includes a replica cell transistor RCT arranged between a pMOS transistor PM and an nMOS transistor NM of the CMOS inverter IV1. That is, the drain of the pMOS transistor PM is coupled to the drain of the nMOS transistor NM via the replica cell transistor RCT. The nMOS transistor NM operates as a switch transistor, which couples the source of the replica cell transistor RCT to the ground line VSS, when the operation enable signal RDEN is activated to a high level. In response to a change of the output node N01 from a high level to a low level, the CMOS inverter IV2 operates as a buffer circuit which generates the sense amplifier enable signal SAE having a high level equal to the power supply voltage VDD.

Figure 10:
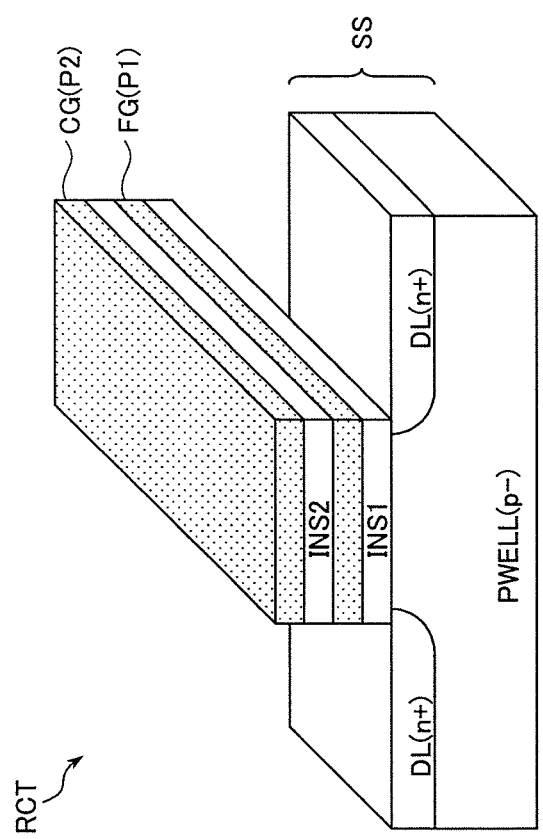
FIG. 10 illustrates an example of the structure of a replica cell transistor illustrated in FIG. 3 and FIG. 8.

In the replica cell transistor RCT, a control gate and a floating gate are coupled to each other. An example of the structure of the replica cell transistor RCT is illustrated in FIG. 10. The replica cell transistor RCT functions as a high-resistance resistor whose resistance between the source and the drain varies according to the control voltage VSA received at its control gate. The control voltage VSA is a constant voltage, and is supplied to the control gate CG of the replica cell transistor RCT regardless of the operation of the semiconductor memory MEM. The capacitor C1 has a capacitance value corresponding to a load capacitance of the bit line BL.

In this embodiment, in the read operation, the word line WL is activated to a high level and the precharge signal PREX is inactivated to a high level. The precharge operation of the bit line BL is stopped due to the inactivation of the precharge signal PREX. When the threshold voltage of the real cell transistor CT is low (e.g., the logic "1" is held), in response to activation of the word line WL a cell current flows from the bit line BL to the source line SL through the real cell transistor CT, and the voltage of the bit line BL gradually decreases. When the threshold voltage of the real cell transistor CT is high (e.g., the logic "0" is held), the cell current will not flow and the voltage of the bit line BL maintains a precharged voltage.

On the other hand, the operation enable signal RDEN is activated to a high level in accordance with a later timing of the activation timing of the word line WL and the inactivation timing of the precharge signal PREX. Due to the activation of the operation enable signal RDEN, the precharge operation of the node N01 by the pMOS transistor PM is stopped and the nMOS transistor NM is turned on. By the turning-on of the nMOS transistor NM, the node N01 is coupled to the ground line VSS through the replica cell transistor RCT and the voltage of the node N01 will gradually decrease. In this embodiment, the control voltage VSA is supplied not only to the control gate CG but to the floating gate FG. Thereby, the operation of the replica cell transistor RCT may be controlled with accuracy equal to that of an ordinary transistor. In contrast, when a floating gate FG not coupled to the control voltage line acts as a capacitor, it is difficult to control the state of a channel region by the voltage of the control gate CG.

Furthermore, because the load capacitance of the node N01 is matched with the load capacitance of the bit line BL, the decreasing speed of the voltage of the node N01 may be matched with the decreasing speed of the voltage of the bit line BL. Moreover, because the precharge voltage of the node N01 is set to the power supply voltage VDD, the power supply voltage VDD may be supplied to the inverter IV2 and the sense amplifier enable signal SAE may be generated without interposing a level shifter or the like. On the other hand, when the node N01 is set to the same precharge voltage VPR as the bit line BL, the precharge voltage VPR needs to be supplied to a source of the pMOS transistor of the CMOS inverter IV2 in place of the power supply voltage VDD in order to prevent a power supply leak of the inverter IV2. As a result, a level shifter for converting a high level of the sense amplifier enable signal SAE from the precharge voltage VPR to the power supply voltage VDD is required and it is difficult to suppress variations in the activation timing of the sense amplifier enable signal SAE. From the above, in this embodiment, the activation timing of the sense amplifier enable signal SAE may be controlled with a high accuracy.

The timing generation unit TGEN activates the sense amplifier enable signal SAE to a high level when the node ND01 changes from a high level to a low level. The sense amplifier SA operates in response to the activation of the sense amplifier enable signal SAE, inverts the logic level appearing on the bit line BL, and outputs the inverted logic level to the data line DT. Then, the read operation is completed. Note that, the semiconductor memory MEM performs the same operation as the above-described read operation, in a program verification operation at the time of a write operation and in an erase verification operation at the time of an erase operation. That is, the program verification operation and the erase verification operation are one type of the read operation.

In the foregoing, in this embodiment, regardless of fluctuations in the manufacturing conditions of the semiconductor memory MEM, the activation timing of the sense amplifier enable signal SAE may be always optimally generated. In particular, by short-circuiting the floating gate FG to control gate CG of the replica cell transistor RCT, the activation timing of the sense amplifier enable signal SAE may be controlled with a high accuracy. As a result, a read margin of the semiconductor memory MEM may be improved.

FIG. 2 illustrates an example of the semiconductor memory MEM in another embodiment. For example, the semiconductor memory MEM is a nonvolatile semiconductor memory, such as a flash memory. The semiconductor memory MEM includes a command generation circuit 10, a test mode control circuit 12, a data input/output circuit 14, an internal voltage generation circuit 16, a CAM (content addressable memory) access control circuit 18, a CAM operation control circuit 22, an internal address generation circuit 24, an address selection circuit 26, a memory core 28, and a bus control circuit 30.

The command generation circuit 10 receives a chip enable signal CEX, a write enable signal WEX, data signals DIN00-15, and the like as command signals, in synchronization with a clock signal CLK. Note that the semiconductor memory MEM may operate asynchronously with the clock signal CLK. When the command signal indicates the read command, the command generation circuit 10 outputs a read control signal RD in order to execute the read operation. When the command signal indicates a write command, the command generation circuit 10 outputs a program control signal PGM in order to execute the write operation. When the command signal indicates an erase command, the command generation circuit 10 outputs an erase control signal ERS in order to execute the erase operation. When the command signal indicates a test command, the command generation circuit 10 outputs a test mode signal TM.

The test mode control circuit 12 outputs a plurality of test control signals TCNT in order to set the internal state (initial value) of the semiconductor memory MEM, according to address signals FA (FA00-FA20) supplied together with the test command. For example, by the test control signals TCNT, a value held in CAM is changed and the value of an internal voltage generated by the internal voltage generation circuit 16 is changed.

The data input/output circuit 14 receives write data via the data input terminals DIN (DIN00-DIN15) at the time of write operation, and outputs the received data to an input data line DTIN. The data input/output circuit 14 receives read data from the memory core 28 via an output data line DTOUT at the time of read operation, and outputs the received data to data output terminals DO (DO00-DO15). Note that the number of bits of the data input terminal DIN and data output terminal DO is not limited to 16 bits. Moreover, the number of bits of the data output terminal DO may differ from that of the data input terminal DIN. For example, the number of bits of the data output terminal DO may be four times the number of bits of the data input terminal DIN.

The internal voltage generation circuit 16 generates internal voltages HV1, HV2, HV3, VPR, NV, and the like based on the power supply voltage VDD and the ground voltage VSS. The internal voltages HV1, HV2 and HV3 are higher than the power supply voltage VDD, where HV1>HV2>HV3, for example. The internal voltage VPR is a positive value lower than the power supply voltage VDD and the internal voltage VN is a negative voltage. In the description below, the internal voltages HV1, HV2, HV3 and VPR are also referred to as high voltages HV1, HV2, HV3, and a precharge voltage VPR, respectively. For example, the high voltage HV1 is used for a high level voltage (program voltage) of the word line WL (illustrated in FIG. 4 and FIG. 11 and the like) at the time of write operation. The high voltage HV2 is used for a high level voltage (read voltage) of the word line WL at the time of read operation. The high voltage HV3 is used for a high level voltage (verification voltage) of the word line WL at the time of write verification operation during the write operation and at the time of erase verification operation during the erase operation. The precharge voltage VPR is used to precharge a local bit line BL and a global bit line GBL illustrated in FIG. 11. The negative voltage NV is used for a low level voltage (erase voltage) of the word line WL at the time of erase operation.

Figure 3:
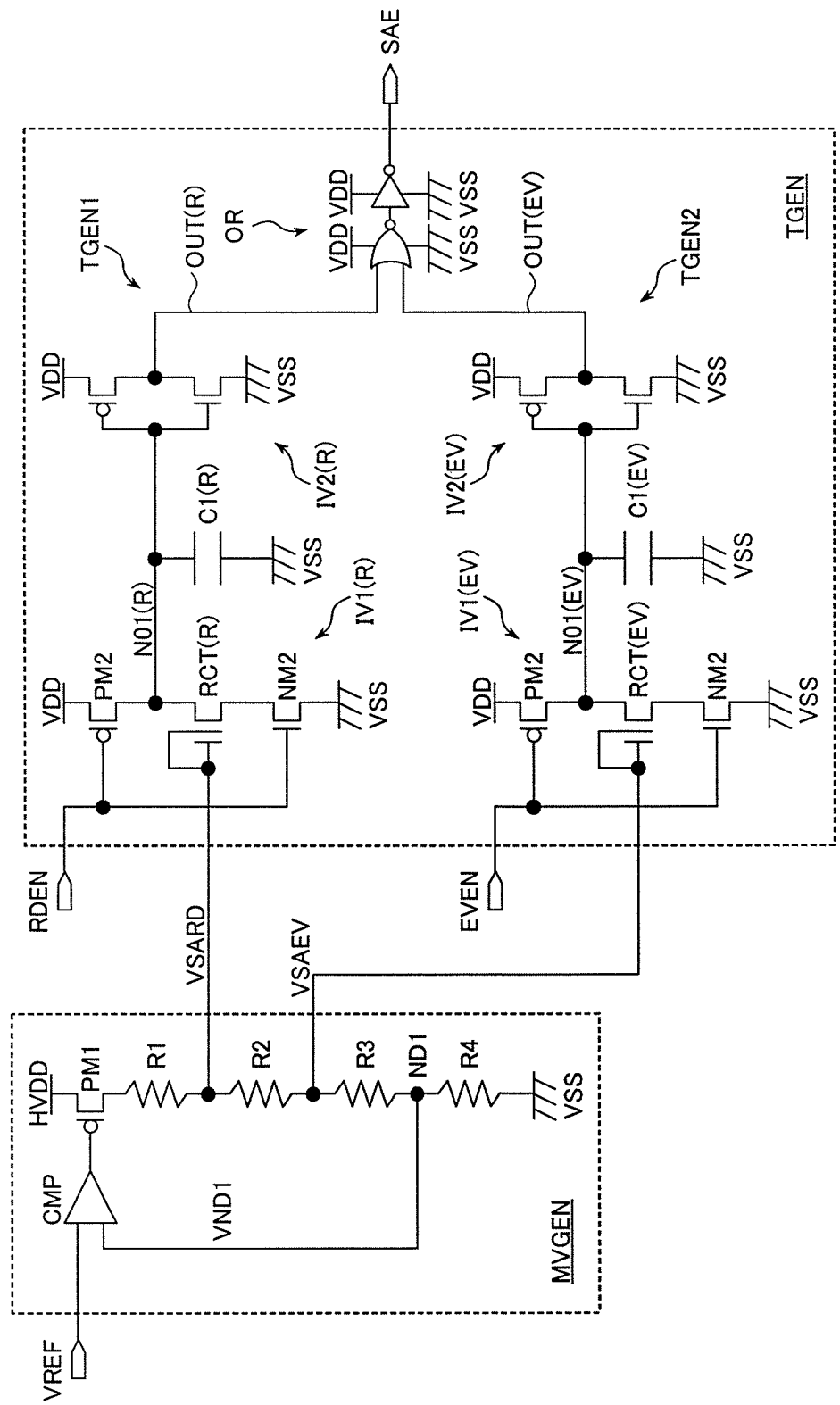
FIG. 3 illustrates an example of a monitor voltage generation unit and a timing generation unit illustrated in FIG. 2.

Moreover, the internal voltage generation circuit 16 includes a monitor voltage generation unit MVGEN which generates control voltages VSAEV, VSARD supplied to the timing generation unit TGEN. The control voltages VSAEV, VSARD are used to determine an operation timing of the sense amplifier SA illustrated in FIG. 11. An example of the monitor voltage generation unit MVGEN is illustrated in FIG. 3. The values of the control voltages VSAEV, VSARD generated by the internal voltage generation circuit 16 may be changed according to set information SINF read from the CAM or the test control signal TCNT (trimming signal). Note that the power supply voltage VDD is also supplied to other circuits of the semiconductor memory MEM. When the power supply voltage VDD is assumed to fluctuate with chip temperature and the like, a constant power supply voltage which will not follow the fluctuation in the power supply voltage VDD may be generated by the internal voltage generation circuit 16 by use of the power supply voltage VDD.

The CAM access control circuit 18 outputs a CAM write command to the CAM according to the test control signal TCNT, in order to write into the CAM the set information SINF for setting the values of the control voltages VSAEV, VSARD. The CAM, as with the memory cell array 32 illustrated in FIG. 4, includes a plurality of nonvolatile memory cells each having a floating gate and stores the set information SINF. The CAM outputs the set information SINF stored in the memory cell to the internal voltage generation circuit 16, in response to a read request from the command generation circuit 10. The internal voltage generation circuit 16 latches the set information SINF from the CAM, and generates the control voltages VSAEV, VSARD corresponding to the set information SINF.

In this embodiment, in the manufacturing process of the semiconductor memory MEM, the test control signal TCNT is supplied to the internal voltage generation circuit 16, and the test of the semiconductor memory MEM is performed while changing the values of the control voltages VSAEV, VSARD. Then, the optimum values of the control voltages VSAEV, VSARD are found. The set information SINF indicative of the optimum values of the control voltages VSAEV, VSARD is supplied to the CAM access control circuit 18 as the test control signal TCNT, and is written into the CAM. In this embodiment, an address supplied from an address terminal FA designates a location where the set information SINF is written. The set information SINF is written into the CAM, so that the monitor voltage generation unit MVGEN generates the optimum control voltages VSAEV, VSARD for each semiconductor memory chip MEM in order to increase the operation margin of each semiconductor memory chip MEM. Then, the semiconductor memory MEM is shipped.

Afterward, the semiconductor memory MEM implemented into a system SYS (FIG. 16) or the like will receive an initial set command during a power-on sequence of the system SYS. The command generation circuit 10 outputs a read request to the CAM in response to the initial set command. Then, based on the set information SINF held in the CAM, the control voltages VSAEV, VSARD are set to the optimum values.

The operation control circuit 22 outputs a plurality of operation control signals (timing signals) for operating the memory core 28 according to the read control signal RD, program control signal PGM, and erase control signal ERS from the command generation circuit 10. The operation control circuit 22 includes the timing generation unit TGEN. The timing generation unit TGEN generates an activation timing of the sense amplifier SA (FIG. 11) using the control voltage VSARD, at the time of read operation. Moreover, at the time of program verification operation during the write operation and at the time of erase verification operation during the erase operation, the timing generation unit TGEN generates the activation timing of the sense amplifier SA using the control voltage VSAEV. An example of the timing generation unit TGEN is illustrated in FIG. 3.

At the time of erase verification operation during the erase operation, the internal address generation circuit 24 sequentially generates an internal address signal IA (column address signal) for selecting a plurality of global bit lines GBL. The address selection circuit 26 output the address signal which is supplied via the address terminals (FA00-FA20) or the internal address signal IA as a row address signal RA and a column address signal CA. The row address signal RA is used for selection of a sector SEC and for selection of the word line WL in a selected sector SEC. The column address signal CA is used for selection of the bit line BL (FIG. 4 and FIG. 11 and the like) in the selected sector SEC. Note that, in this example, 21 bits of address signals FA00-FA20 are supplied to the semiconductor memory MEM, however the number of bits of the address signal FA is not limited to 21 bits.

Figure 4:
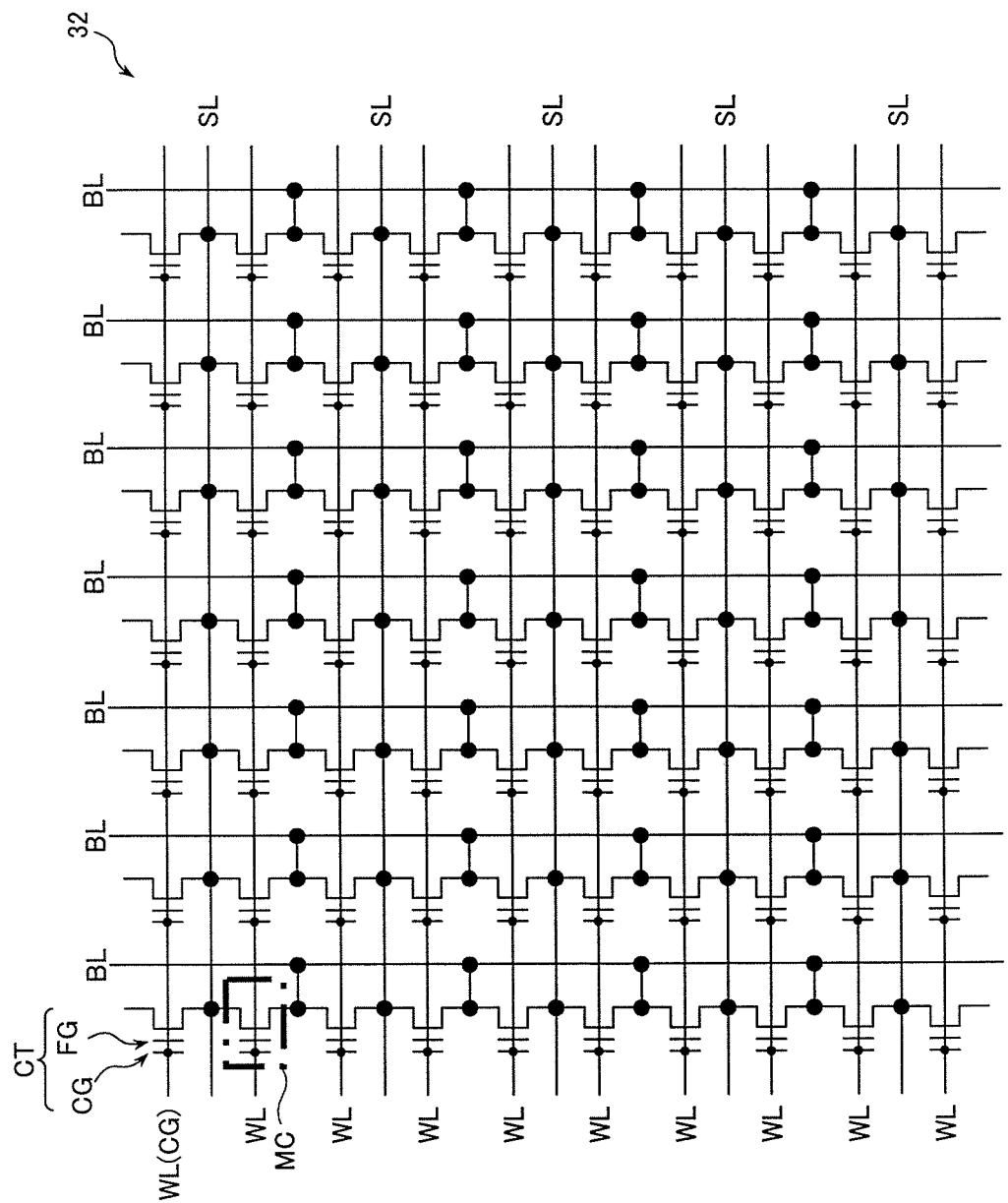
FIG. 4 illustrates an example of a memory cell array illustrated in FIG. 2.
Figure 8:
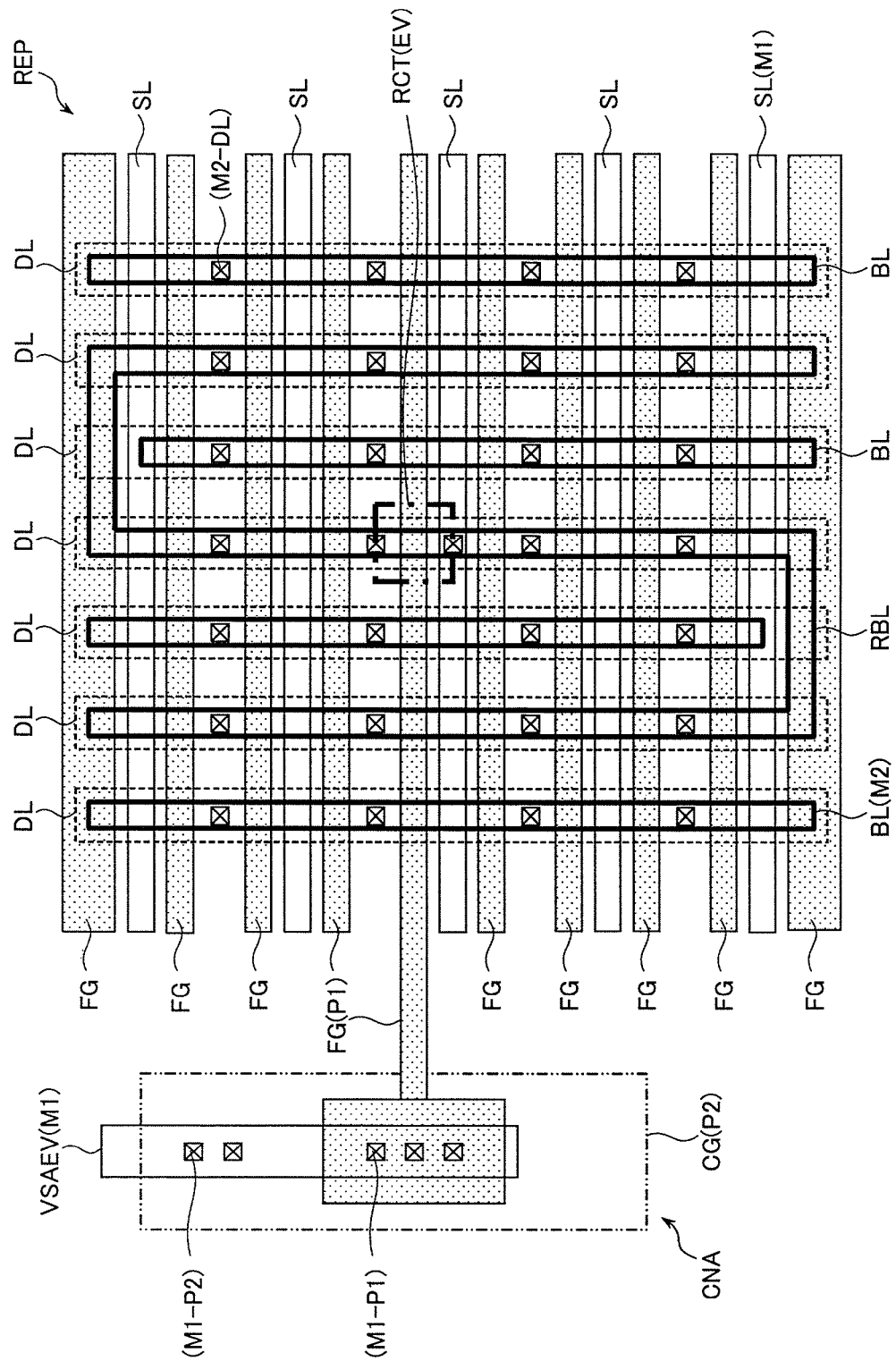
FIG. 8 illustrates an example of the layout of a replica unit illustrated in FIG. 2.
Figure 9:
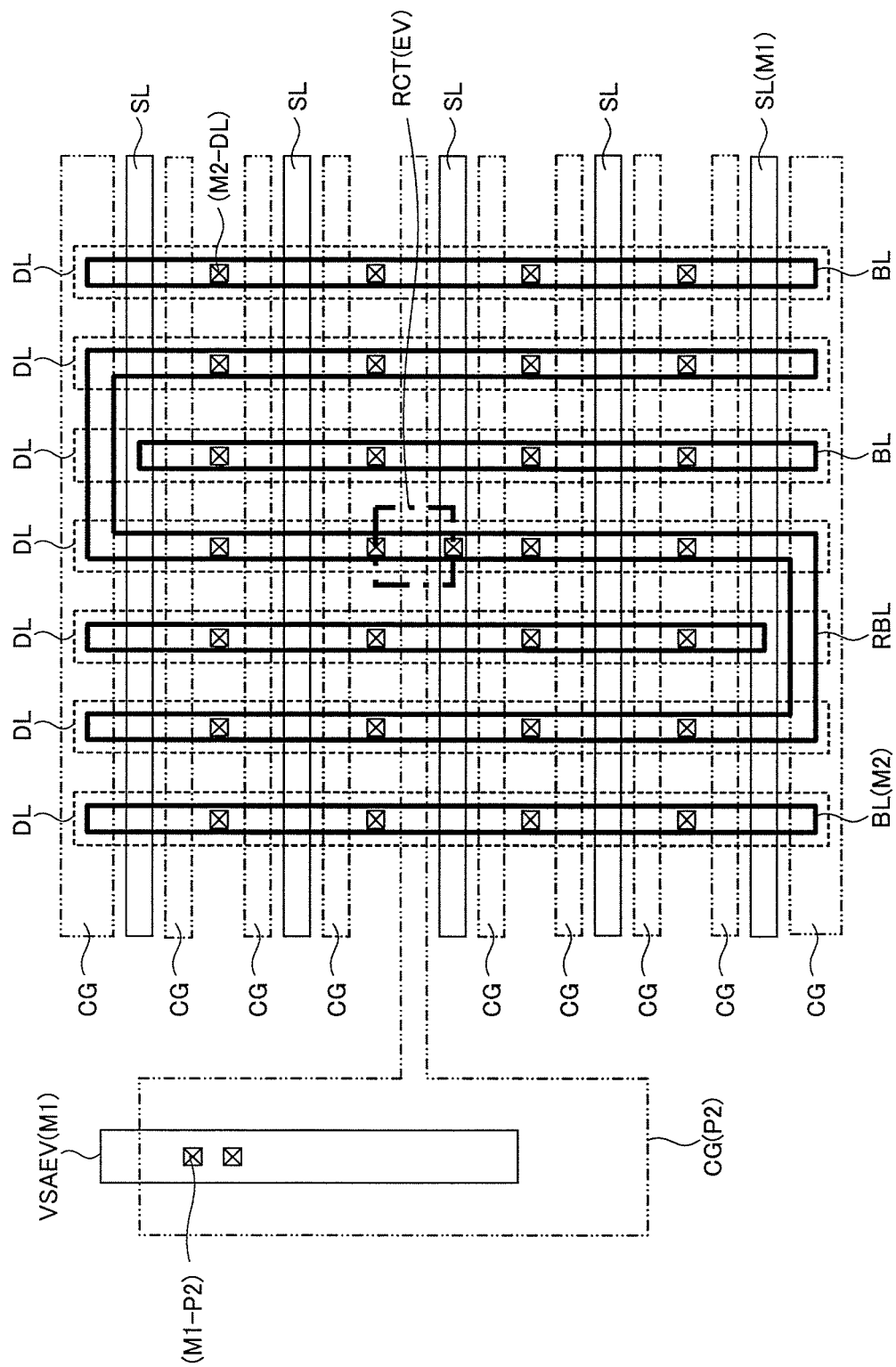
FIG. 9 illustrates an example of the layout of the replica unit, with the pattern of a floating gate removed from FIG. 8.
Figure 11:
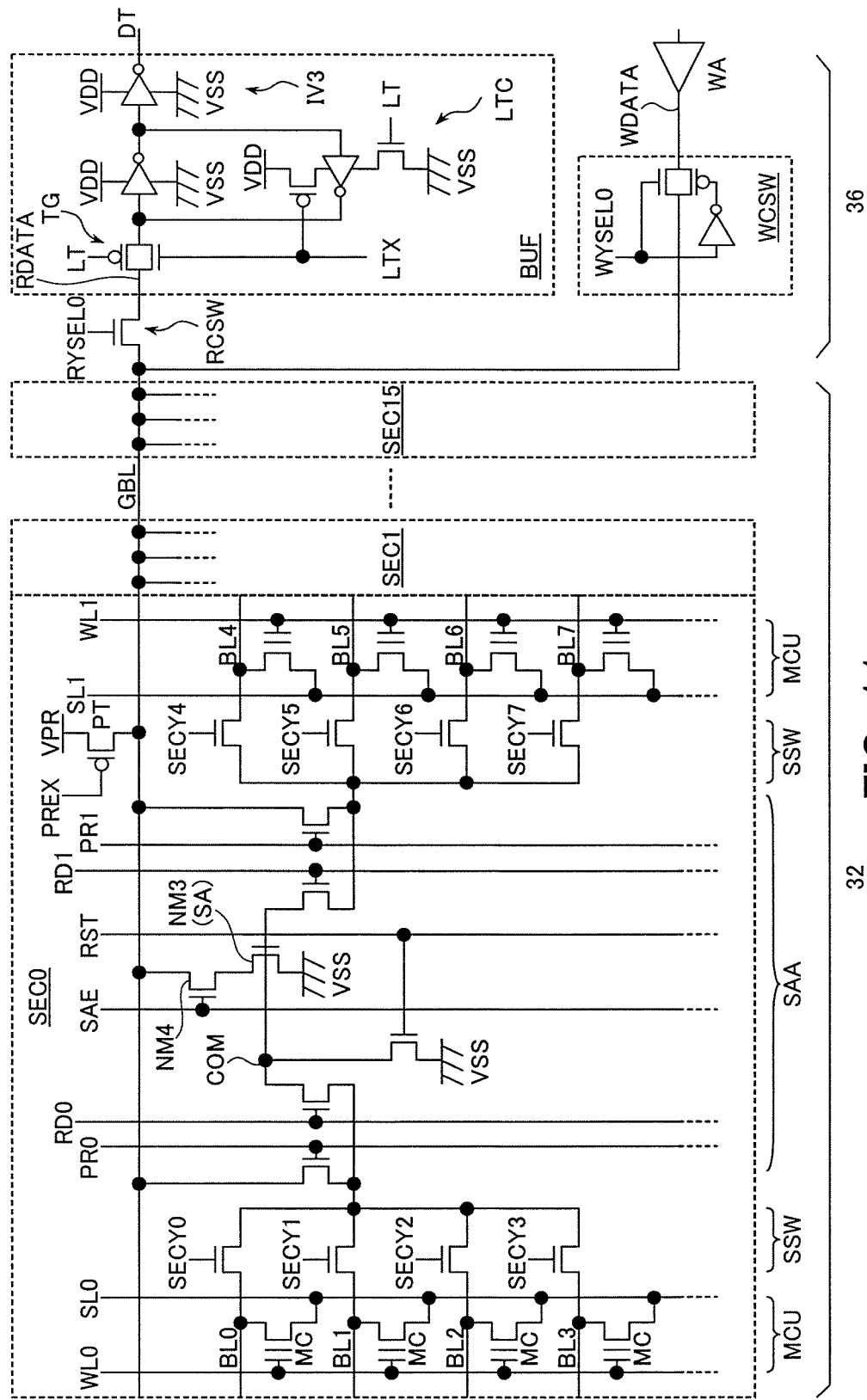
FIG. 11 illustrates an example of a buffer circuit formed in the memory cell array and a Y control circuit illustrated in FIG. 2.

The memory core 28 includes the memory cell array 32, an X control circuit 34, a Y control circuit 36, a replica unit REP, a read amplifier RA, and a write amplifier WA. The memory cell array 32 includes a plurality of sectors SEC (e.g., 16 sectors). Each of the sectors SEC has the same configuration except that its sector address differs from each other. An example of the sector SEC is illustrated in FIG. 4 and FIG. 11. The replica unit REP includes a replica cell transistor RCT (FIG. 10) having the same device structure as that of the real cell transistor of the memory cell formed in the memory cell array 32. In FIG. 2, the replica unit REP is formed adjacent to the memory cell array 32, however it may be formed in a place away from the memory cell array 32. An example of the replica unit REP is illustrated in FIG. 8 to FIG. 10.

The X control circuit 34 receives the operation control signal and row address signal RA from the operation control circuit 22, and sets the word line WL and source line SL illustrated in FIG. 4 and FIG. 11 to a predetermined voltage, respectively. An example of the signal generated by the X control circuit 34 is illustrated in FIG. 11. The Y control circuit 36 includes a decoder YDEC which receives the operation control signal and column address signal CA from the operation control circuit 22 and generates a selection signal SECY for selecting the bit line BL illustrated in FIG. 4 and FIG. 11. Moreover, the Y control circuit 36 includes a read column switch RCSW (FIG. 11) which couples the global bit line GBL designated by the column address signal CA to the read amplifier RA. The Y control circuit 36 further includes a write column switch WCSW (FIG. 11) which couples the global bit line GBL designated by the column address signal CA to the write amplifier WA.

The read amplifier RA operates at the time of read operation, and outputs to a common data bus CDB the read data received via the global bit line GBL. The write amplifier WA operates at the time of write operation, and outputs to any one of the global bit lines GBL the write data received via the common data bus CDB. The bus control circuit 30 outputs to the output data line DTOUT the read data received via the common data bus CDB, at the time of read operation. The bus control circuit 30 outputs to the common data bus CDB the write data received via the input data line DTIN, at the time of write operation.

FIG. 3 illustrates an example of the monitor voltage generation unit MVGEN and timing generation unit TGEN illustrated in FIG. 2. The monitor voltage generation unit MVGEN includes a pMOS transistor PM1 and resistors R1-R4 coupled in series between a voltage line HVDD and the ground line VSS, and a comparator CMP coupled to the gate of the pMOS transistor PM1. The voltage of the voltage line HVDD is generated by the internal voltage generation circuit 16, and is higher than the power supply voltage VDD. The monitor voltage generation unit MVGEN generates a control voltage VSARD used in the read operation, from a connection node between the resistors R1, R2. The monitor voltage generation unit MVGEN generates a control voltage VSAEV used in the program verification operation and the erase verification operation, from a connection node between the resistors R2, R3. The control voltage VSAEV is lower than the control voltage VSARD. For example, the control voltages VSARD, VSAEV are always generated as long as the semiconductor memory MEM has not yet entered a sleep mode or the like, while the power supply voltage VDD is supplied to the semiconductor memory MEM.

The comparator CMP compares a divided voltage VND1 generated at a connection node ND1 between the resistor R3 and a resistor R4 with a reference voltage VREF and generates a control voltage to be supplied to the gate of the pMOS transistor PM1. For example, the reference voltage VREF is generated by the internal voltage generation circuit 16 illustrated in FIG. 2. The comparator CMP decreases the control voltage when the divided voltage VND1 is lower than the reference voltage VREF. Accordingly, the resistance value between the source and drain of the pMOS transistor PM1 decreases and the voltage VND1 increases. The comparator CMP increases the control voltage when the voltage VND1 is higher than the reference voltage VREF. Accordingly, the resistance value between the source and drain of the pMOS transistor PM1 increases and the voltage VND1 decreases. Through the above-described operation, the control voltages VSARD, VSAEV are held at a constant value, respectively.

In addition, as described above, the control voltages VSARD, VSAEV are trimmable. Therefore, in the actual circuit, the resistor R1 includes a number of sub-resistors coupled in series, and the control voltage VSARD is generated from one connection node of one sub-resistor pair which is selected according to the set information SINF. Similarly, the resistor R3 includes a number of sub-resistors coupled in series, and the control voltage VSAEV is generated from one connection node of one sub-resistor pair which is selected according to the set information SINF.

The timing generation unit TGEN includes a first generation unit TGEN1 used at the time of read operation, a second generation unit TGEN2 used at the time of program verification operation and at the time of erase verification operation, and an OR circuit. The timing generation unit TGEN operates upon receipt of the power supply voltage VDD. Because the first generation unit TGEN1 and second generation unit TGEN2 are the same circuit, the first generation unit TGEN1 is mainly described.

The first generation unit TGEN1 includes CMOS inverters IV1(R), IV2(R) coupled in series, and a capacitor C1(R) coupled between an output node N01(R) of the CMOS inverter IV1(R) and the ground line VSS. The input of the CMOS inverter IV1(R) receives the operation enable signal RDEN, which is activated to a high level at the time of read operation. The operation enable signal RDEN is generated by the operation control circuit 22 illustrated in FIG. 2. In the CMOS inverter IV1(R), the drain of a pMOS transistor PM2 is coupled to the drain of an nMOS transistor NM2 via a replica cell transistor RCT(R). The replica cell transistor RCT (R) has a control gate and a floating gate coupled to each other, and is formed in the replica unit REP illustrated in FIG. 2. An example of the structure of the replica cell transistor RCT(R) is illustrated in FIG. 10. The replica cell transistor RCT(R) functions as a high-resistance resistor whose resistance value between the source and the drain varies according to the control voltage VSARD received at the control gate.

The first generation unit TGEN1 charges the capacitor C1(R) through the pMOS transistor PM2 in a period during which the operation enable signal RDEN is inactivated to a low level. Moreover, the first generation unit TGEN1 discharges the capacitor C1(R) through the replica cell transistor RCT(R) and nMOS transistor NM2 in response to a change in the high level of the operation enable signal RDEN. Then, the first generation unit TGEN1 sets an output signal OUT(R) to a high level when the output node N01(R) has changed to a low level due to the discharge. That is, the output signal OUT(R) changes to a high level after a predetermined delay time from a change of the operation enable signal RDEN to the high level.

The second generation unit TGEN2 receives, at the input of the CMOS inverter IV1 (EV), the operation enable signal EVEN which changes to a high level at the time of program verification operation and at the time of erase verification operation. The operation enable signal EVEN is generated by the operation control circuit 22 illustrated in FIG. 2. The replica cell transistor RCT(EV) has a control gate and a floating gate coupled to each other and is formed in the replica unit REP illustrated in FIG. 2. An example of the structure of the replica cell transistor RCT(EV) is illustrated in FIG. 10. The replica cell transistor RCT(EV), as with the replica cell transistor RCT(R), functions as a high-resistance resistor whose resistance between the source and the drain varies according to the control voltage VSAEV received at the control gate.

The second generation unit TGEN2, as with the first generation unit TGEN1, charges a capacitor C1(EV) during inactivation of the operation enable signal EVEN and discharges the capacitor C1(EV) in response to the activation of the operation enable signal EVEN to a high level. Then, the second generation unit TGEN2 changes an output signal OUT(EV) to a high level after a predetermined delay time from a change of the operation enable signal EVEN to the high level. An OR circuit outputs the output signal OUT(R) or output signal OUT(EV) as the sense amplifier enable signal SAE.

FIG. 4 illustrates an example of the memory cell array 32 illustrated in FIG. 2. FIG. 4 illustrates a part of the sector SEC region within the memory cell array 32. The memory cell array 32 includes: the memory cells MC arranged in a matrix (one of them is indicated by a bold dash-dot line frame); the word line WL and the source line SL wired in the horizontal direction of FIG. 4; and the bit line BL wired in the vertical direction of FIG. 4. Each memory cell MC includes the real cell transistor CT having the floating gate FG and the control gate CG.

Each word line WL is commonly coupled to each control gate CG of the real cell transistors CT arrayed in the horizontal direction of FIG. 4. In the following description, the word line WL is also referred to as a control gate line CG. Each source line SL is commonly coupled to either one of the source and drain of the respective real cell transistors CT arrayed in the horizontal direction of FIG. 4. Each bit line BL is commonly coupled to the other one of the source and drain of the respective real cell transistors CT arrayed in the vertical direction of FIG. 4. Thus, the memory cell array 32 has the same structure as that of the so-called NOR type flash memory.

Figure 5:
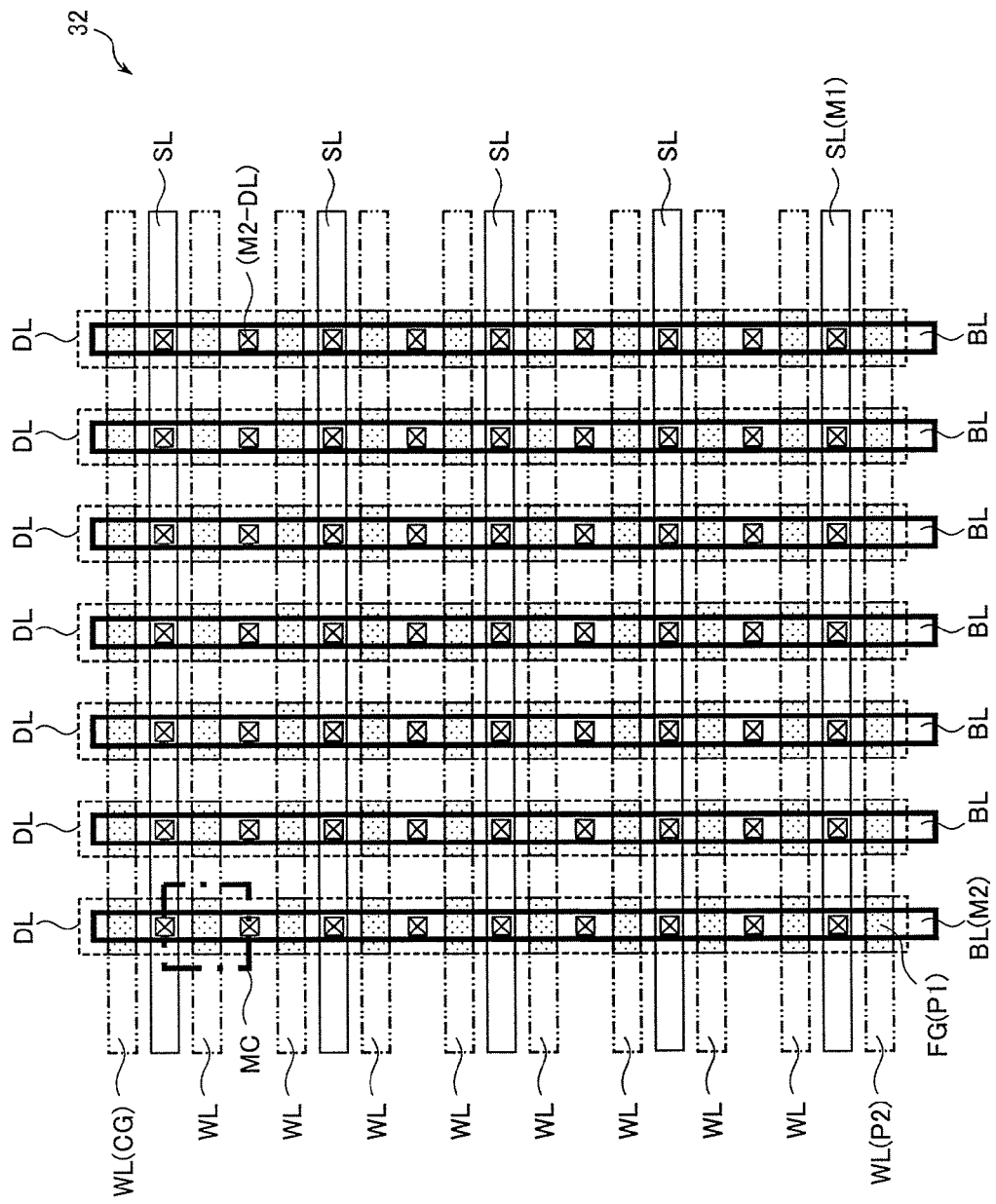
FIG. 5 illustrates an example of the layout of the memory cell array illustrated in FIG. 4.

FIG. 5 illustrates an example of the layout of the memory cell array 32 illustrated in FIG. 4. The range illustrated in FIG. 5 is the same as that illustrated in FIG. 4. In FIG. 5, a frame of thick one-dot chain line indicates a region in which one memory cell MC is formed. A pattern of broken line indicates a diffusion layer DL. A shaded pattern indicates a first polysilicon wiring layer P1 in which the floating gate FG of the memory cell MC is formed. A pattern of two-dot chain line indicates a second polysilicon wiring layer P2 in which the word line WL and the control gate CG of the memory cell MC are formed. A narrow solid line pattern indicates a first metal wiring layer M1 in which the source line SL and the like are formed. A thick solid line pattern indicates a second metal wiring layer M2 which is formed above the first metal wiring layer M1 (on a far side of a semiconductor substrate) and in which the bit line BL and the like are formed.

A square attached with a "X" mark indicates a contact region which couples between the wiring layers or between the wiring layer and the diffusion layer DL. The contact region above the source line SL couples the first metal wiring layer M1 to the diffusion layer DL. The contact region formed above the bit line BL and away from the source line SL couples the second metal wiring layer M2 (bit line BL) to the diffusion layer DL. Note that, in FIG. 5, for the purpose of preventing lines from overlapping with each other and improving the visibility of this drawing, the width of the diffusion layer DL is made wider than that of the second metal wiring layer M2.

Figure 6:
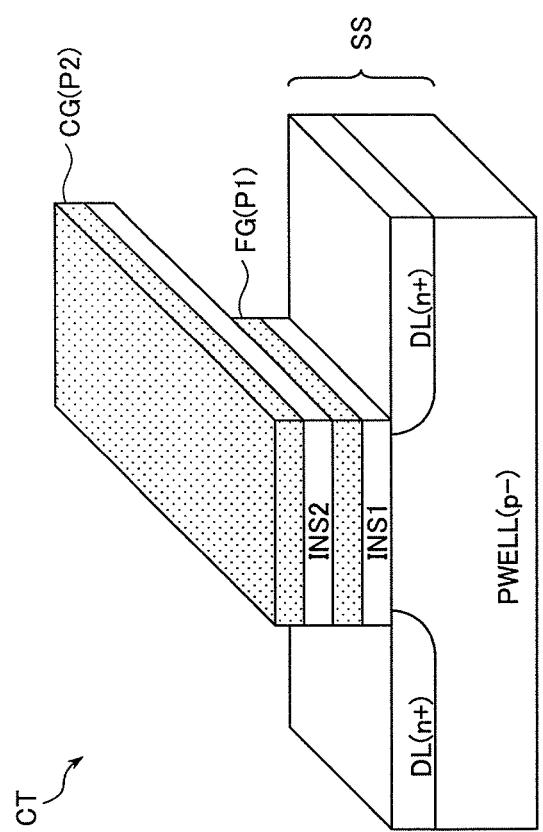
FIG. 6 illustrates an example of the structure of a real cell transistor illustrated in FIG. 4.

FIG. 6 illustrates an example of the structure of the real cell transistor CT illustrated in FIG. 4. The real cell transistor CT is formed by laminating a first insulator film INS1, the floating gate FG, a second insulator film INS2, and the control gate CG above a semiconductor substrate SS. The semiconductor substrate SS includes a p-type well region PWELL (p−), and an n-type diffusion region DL (n+) which is selectively formed in the surface of the p-type well region PWELL (p−). The p-type well region PWELL (p−) facing the floating gate FG serves as the channel region of the real cell transistor CT. Two n-type diffusion regions DL (n+) function as the source region and drain region of the real cell transistor CT.

Figure 7:
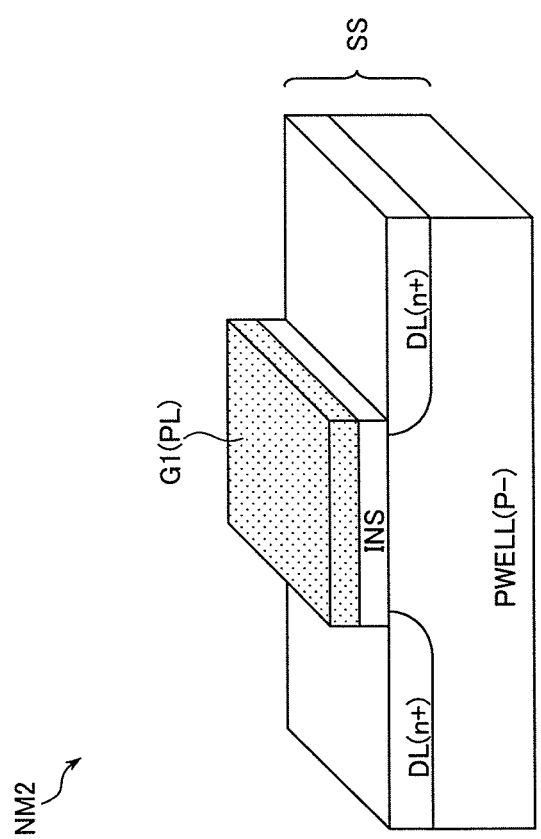
FIG. 7 illustrates an example of the structure of an ordinary transistor.

FIG. 7 illustrates an example of the structure of an ordinary transistor. The ordinary transistor is the nMOS transistor NM2 or the like illustrated in FIG. 3. The semiconductor substrate SS is the same as that of FIG. 6. The ordinary transistor is formed by laminating the insulator film INS and the gate wiring G1 which is formed using the polysilicon wiring layer PL, over the semiconductor substrate SS.

FIG. 8 illustrates an example of the layout of the replica unit REP illustrated in FIG. 2. FIG. 8 illustrates a layout for forming the replica cell transistor RCT(EV) illustrated in FIG. 3. The layout for forming the replica cell transistor RCT(R) is the same as that of FIG. 8 except that the pattern of the control voltage VSARD is formed in place of the pattern of the control voltage VSAEV. The types of lines for identifying each layout pattern are the same as FIG. 5.

The replica unit REP has the same layout as that of the memory cell array 32 illustrated in FIG. 5. The replica unit REP differs from the memory cell array 32 in that the contact is not formed in the source line SL except in the replica cell transistor RCT, that the floating gate FG is an elongated pattern as with the control gate line CG illustrated in FIG. 5, and that the replica bit line RBL meanders.

For example, the sizes of the source region, drain region, and channel region repeatedly disposed over the semiconductor substrate in which the replica unit REP is formed are the same as the sizes of the source region, drain region, and channel region repeatedly disposed over the semiconductor substrate in which the memory cell array 32 is formed, respectively. Thus, when the electric characteristic of the real cell transistor CT changes with the fluctuation in the manufacturing conditions of the semiconductor memory MEM, the electric characteristic of the replica cell transistor RCT may be caused to change similarly. Moreover, when the electric characteristic of the real cell transistor CT changes with the fluctuation in the temperature of the semiconductor memory MEM, the electric characteristic of the replica cell transistor RCT may be caused to change similarly.

The load capacitance of the meandering replica bit line RBL corresponds to the capacitance of the capacitor C1(EV) illustrated in FIG. 3. The wiring width and length of the meandering replica bit line RBL are set to be the same as the wiring width and length of one bit line BL (FIG. 4) wired within each sector SEC. Moreover, the interval between the contacts formed in the meandering replica bit line RBL is equal to the interval between the contacts formed in one bit line BL wired within each sector SEC. Thus, the load capacitance of the meandering replica bit line RBL is set to be the same as the load capacitance of one bit line BL wired within each sector SEC. Therefore, when the semiconductor memory MEM is manufactured, the fluctuation in the wiring width and the like of the replica bit line RBL may be made the same as that of the bit line BL, and the fluctuation in the load capacitance of the replica bit line RBL may be made the same as that of the bit line BL. Accordingly, the electric characteristic of the replica bit line RBL may be made substantially the same as that of the bit line BL regardless of the fluctuation in the manufacturing conditions. The bit line BL sandwiched by the meandering replica bit line RBL functions as a dummy counter-electrode line. The width of the pattern of the upper and lower floating gates FG in FIG. 8 is formed thick in order to prevent influences, such as halation, when manufacturing the semiconductor memory MEM.

Note that, the resistance value and load capacitance of the floating gate FG of the replica cell transistor RCT are high because the pattern length of the floating gate FG is long. However, the control voltage VSAEV supplied to the floating gate FG of the replica cell transistor RCT is maintained at a constant value while the power supply voltage VDD is supplied to the semiconductor memory MEM. Therefore, there is no need to take into consideration a delay time caused by the elongation of the pattern of the floating gate FG.

The replica cell transistor RCT indicated by a frame of thick one-dot chain line is formed substantially in the center of the replica unit REP. The floating gate FG of the replica cell transistor RCT extends to a connection area CNA of the control voltage line VSAEV. The floating gate FG is coupled to the control voltage line VSAEV (the first metal wiring layer M1) through a contact in the connection area CNA. Moreover, the control voltage line VSAEV is coupled to the control gate line CG (the second polysilicon layer P2) through a contact. That is, the floating gate FG and the control gate CG of the replica cell transistor RCT are coupled to each other. By coupling the floating gate FG to the control gate CG at a place away from the replica cell transistor RCT, the shape of the replica cell transistor RCT may be made substantially the same as that of the real cell transistor CT. As a result, the electric characteristic of the replica cell transistor RCT may be made substantially the same as that of the real cell transistor CT.

FIG. 9 illustrates an example of the layout of the replica unit REP, with the pattern of the floating gate FG removed from FIG. 8. In FIG. 9, the contact coupled to the floating gate FG is eliminated. The pattern of the control gate line CG is formed in the same manner as with the pattern of the word line WL of the memory cell array 32 illustrated in FIG. 5.

FIG. 10 illustrates an example of the structure of the replica cell transistor RCT(RCT(R), RCT(EV)) illustrated in FIG. 3 and FIG. 8. The structure of the replica cell transistor RCT is the same as that of the real cell transistor CT illustrated in FIG. 6 except that the floating gate FG and the first insulator film INS1 together with control gate CG are formed long. Accordingly, the electric characteristic of a cell current flowing between the source and drain of the replica cell transistor RCT may be made the same as that of a cell current flowing between the source and drain of the real cell transistor CT. For example, when the threshold voltage of the real cell transistor CT becomes higher than a typical value due to the fluctuation in the manufacturing conditions of the semiconductor memory MEM, the threshold voltage of the replica cell transistor RCT becomes higher similarly.

Usually, as the threshold voltage increases, the current flowing through the transistor will decrease. When the cell current flowing through the memory cell MC decreases, the time until the magnitude of the cell current is detected by the sense amplifier SA (FIG. 11) needs to be increased. In this embodiment, the cell current flowing through the replica cell transistor RCT varies similarly to a change in the cell current flowing through the memory cell MC. Therefore, as described in FIG. 12 and FIG. 13, the activation timing of the sense amplifier SA may be always optimally set in accordance with the variation of the cell current of the memory cell MC due to the fluctuation in the manufacturing conditions.

FIG. 11 illustrates an example of the buffer circuit BUF, read column switch RCSW, and write column switch WCSW formed in the memory cell array 32 and the Y control circuit 36 illustrated in FIG. 2. FIG. 11 illustrates a circuit for accessing the memory cell MC coupled to two word lines WL0-WL1 and eight bit lines BL0-BL7 within a sector SEC0. The selection signal SECY (selection signals SECY0-SECY7) is generated by the Y control circuit 36 illustrated in FIG. 2. The activation periods of the precharge signal PR (PR0-PR1), PREX, read signal RD (RD0-RD1), reset signal RST, sense amplifier enable signal SAE, and word line signal WL (WL0-WL1) are set according to timing signals generated by the operation control circuit 22 illustrated in FIG. 2, respectively.

NMOS transistors receiving the selection signals SECY0-SECY7 at the respective gates operate as a selection switch SSW for selecting any one of the bit lines BL0-BL7. A pMOS transistor PT receiving the precharge signal PREX at its gate operates as a precharge circuit for precharging the global bit line GBL to the precharge voltage VPR. The pMOS transistor PT is turned on when the precharge signal PREX is at a low level. Note that the precharge circuit receiving the precharge signal PREX may be arranged outside the sector SEC0. NMOS transistors receiving precharge signals PR0-PR1 at the respective gates couple the global bit line GBL to the bit lines BL0-BL7, and operate as a precharge transistor or a write transistor. When this nMOS transistor operates as the precharge transistor, the global bit line GBL is precharged to the precharge voltage VPR via the precharge circuit receiving the precharge signal PREX. When this nMOS transistor operates as the write transistor, the global bit line GBL is set to a voltage indicative of the logic of write data via the write amplifier WA and write column switch WCSW.

The nMOS transistors receiving the read signals RD0-RD1 at the respective gates operate as a read switch which is turned on when the logic of data held in the memory cell MC is read. The read switch is turned on at the time of read operation, at the time of program verification operation, and at the time of erase verification operation. The nMOS transistor receiving the reset signal RST at its gate operates as a reset switch which couples the common node COM to the ground line VSS in a standby period during which the semiconductor memory MEM is not accessed. By turning on the reset switch, the bit lines BL0-BL7 are clamped to a low level (VSS) in the standby period.

An NMOS transistor NM3 whose gate is coupled to the common node COM operates as the sense amplifier SA which generates the drain voltage according to the voltage of the common node COM which varies with the memory state of the memory cell MC. That is, the sense amplifier SA determines the logic of data, which is read from the memory cell MC to the common node COM via any one of the bit lines BL0-BL7. An NMOS transistor NM4 receiving the sense amplifier enable signal SAE at its gate transmits an amplification result by the sense amplifier SA to the global bit line GBL. In this example, a sense amplifier area SAA is arranged between two memory cell units MCU. However, the sense amplifier area SAA may be arranged at one end of the sector SEC0 (at the left end or right end of the sector SEC0 of FIG. 11).

The buffer circuit BUF includes a CMOS transmission gate TG, a latch circuit LTC, and an inverter IV3 coupled in series between a read data line RDATA and the data line DT. The latch circuit LTC and the inverter IV3 operate upon receipt of the power supply voltage VDD. When a latch signal LT is at a low level, the CMOS transmission gate TG couples the global bit line GBL to the read data line RDATA. A latch signal LTX is a signal with the inverse logic of the latch signal LT. When the latch signal LT is at a low level, the latch circuit LTC operates as an inverter and latches the logic level corresponding to the voltage of the global bit line GBL in synchronization with the rising edge of the latch signal LT. The inverter IV3 outputs a logic level which is supplied to the input of the latch circuit LTC and held in the latch circuit LTC, to the data line DT.

The read column switch RCSW is an nMOS transistor, which is turned on when it receives at its gate a read column selection signal RYSEL0 of a high level and which couples the global bit line GBL to the read data line RDATA of the buffer circuit BUF. The write column switch WCSW includes a CMOS transmission gate, which is turned on when it receives a write column selection signal WYSEL0 of a high level and which supplies write data WDATA from the write amplifier WA to the global bit line GBL.

Note that FIG. 11 illustrates the circuit corresponding to one global bit line GBL. For example, when the memory cell array 32 includes 128 global bit lines GBL, 128 circuits are formed, the circuit being illustrated in FIG. 11. Then, the global bit line GBL is selected by the read column switch RCSW or write column switch WCSW which is turned on according to the column address signal CA.

Figure 12:
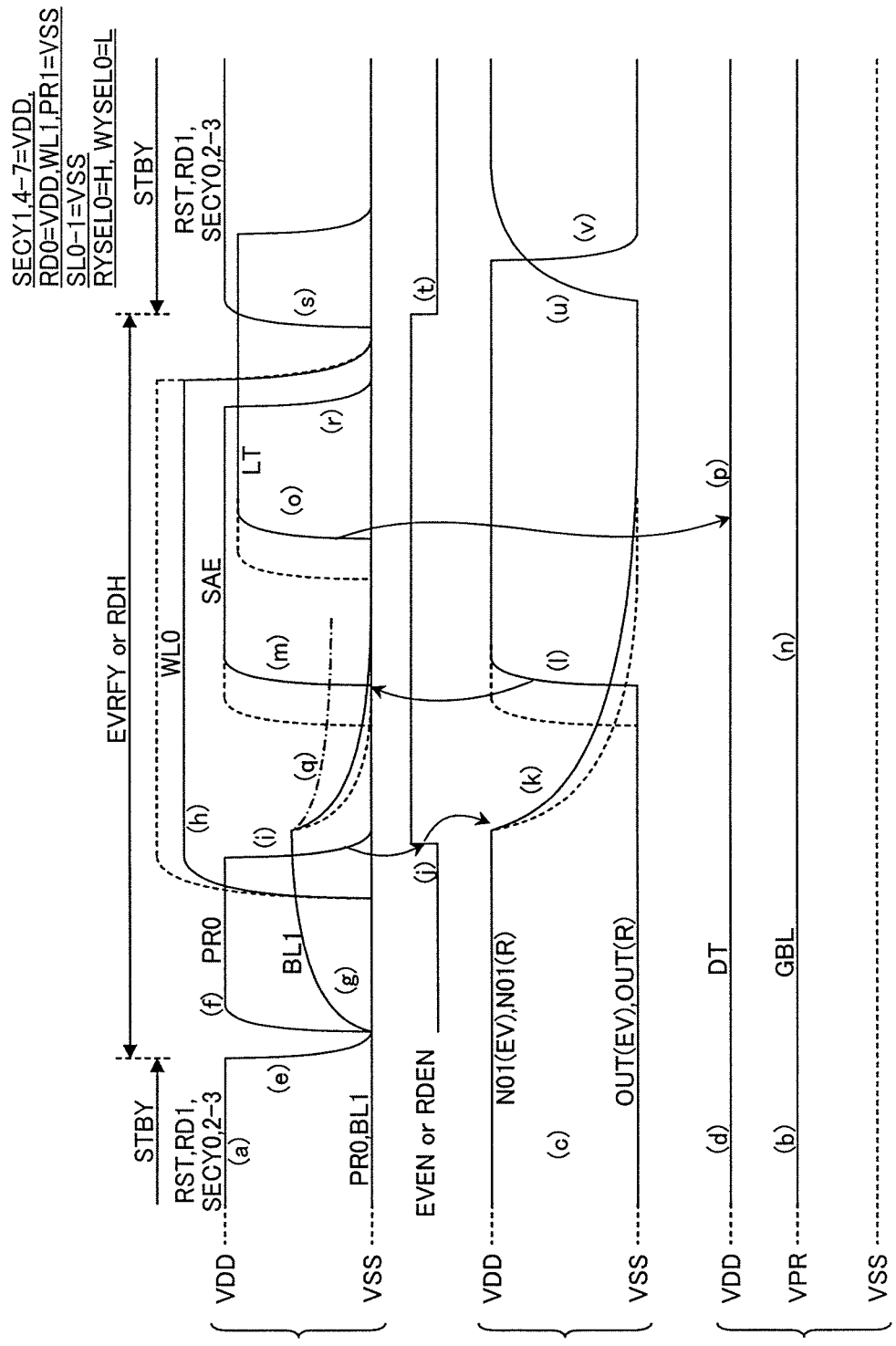
FIG. 12 illustrates an example of an erase verification operation and a read operation (logic "1" is read) of the semiconductor memory illustrated in FIG. 2.

FIG. 12 illustrates an example of the erase verification operation and read operation (logic "1" is read) of the semiconductor memory MEM illustrated in FIG. 2. When the waveform of the erase verification operation differs from that of the read operation, the waveform of the read operation is shown by a broken line. In the read operation, in order to perform the reading of data at high speed, the activation voltage of the word line WL is set higher than at the time of the erase verification operation. Thus, the current flowing through the real cell transistor CT may be increased and the activation timings of the sense amplifier enable signal SAE and latch signal LT may be made earlier. As a result, the read data may be quickly output to the data output terminal DO and the access time may be shortened.

In this example, the memory cell MC coupled to the word line WL0 and bit line BL1 of the sector SEC0 illustrated in FIG. 11 is accessed. Therefore, as shown in the upper right of FIG. 12, the selection signal SECY1 corresponding to the memory cell MC to be accessed is maintained at the high level VDD (e.g., 1.2 V). The selection signals SECY4-SECY7 corresponding to the memory cells MC, which are not coupled to the word line WL0 coupled to the memory cell MC to be accessed, are also maintained at the high level VDD. Note that the voltage of a high logic level of the selection signals SECY0-SECY7 is not limited to the power supply voltage VDD. The read signal RD0 related to the memory cell MC to be accessed is maintained at the high level VDD, and the word line WL1 and precharge signal PR1 not related to the memory cell MC to be accessed are maintained at a low level VSS. Note that the voltage of the high logic level of the read signal RD is not limited to the power supply voltage VDD. The source lines SL0-SL1 are set to the low level VSS. The read column selection signal RYSEL0 illustrated in FIG. 11 is set to a high level, and the write column selection signal WYSEL0 is set to a low level.

First, in a standby period STBY before the erase verification operation or read operation is started, the reset signal RST, the read signals RD0-RD1, and the selection signals SECY0-SECY7 are maintained at the high level VDD, and the selection switch SSW coupled to the reset switch, read switch, and bit lines BL0-BL7 illustrated in FIG. 11 is turned on (FIG. 12(a)). Because all the selection signals SECY0-SECY7 are activated to a high level, the bit lines BL0-BL7 are clamped to the low level VSS via the reset switch, the read switch, and the selection switch SSW.

The global bit line GBL has been precharged to a high level VPR (e.g., 0.9 V) by the precharge signal PREX which is activated to a low level in the standby period STBY (FIG. 12(b)). The operation enable signals EVEN, RDEN are inactivated to a low level. Therefore, the nodes N01(EV), N01(R) of the timing generation unit TGEN illustrated in FIG. 3 are set to the high level VDD, and the output signals OUT(EV), OUT(R) are set to the low level VSS (FIG. 12(c)). The output DT of the buffer circuit BUF illustrated in FIG. 11 is set to the high level VDD upon receipt of the high level VPR of the global bit line GBL (FIG. 12(d)).

Next, the reset signal RST, the read signal RD1, and the selection signals SECY0, SECY2 and SECY3 are inactivated to the low level VSS, and only the bit line BL1 is coupled to the common node COM (FIG. 12(e)). Next, the precharge signal PR0 is activated to the high level VDD, then only the bit line BL1 is precharged via the global bit line GBL (FIG. 12(f, g)). Before the precharge signal PR0 is inactivated to the low level VSS, the word line WL0 is activated to the high level (FIG. 12(h)).

After the word line WL0 is activated, the precharge signal PR0 is inactivated and the bit line BL1 is set to a floating state in a precharged state (FIG. 12(i)). When the threshold voltage of the memory cell MC to be erased or read is low, the voltage of the bit line BL1 decreases to the low level VSS because a cell current flows through the real cell transistor CT.

Moreover, in response to the inactivation of the precharge signal PR0, the operation enable signal EVEN or RDEN is activated to the high level (FIG. 12(j)). Note that the operation control circuit 22 illustrated in FIG. 2 may generate the timing signal for activating the word line WL0, after inactivating the precharge signal PR0. At this time, the operation enable signal EVEN or RDEN is activated in response to the activation of the word line WL0. That is, the operation enable signal EVEN or RDEN is activated in response to a later timing of the inactivation timing of the precharge signal PR0 or the activation timing of the word line WL0.

The timing generation unit TGEN illustrated in FIG. 3 couples the node N01(EV) or N01(R) to the ground line VSS via the replica cell transistor RCT(EV) or RCT(R) in response to the activation of the operation enable signal EVEN or RDEN. Thus, the charge at the node N01(EV) or N01(R) is discharged through the replica cell transistor RCT (EV) or RCT(R). That is, the replica cell transistor RCT(EV) or RCT(R) feeds a replica cell current.

Due to a decrease in the voltage of the node N01(EV) or N01(R), the level of the output signal OUT(EV) or OUT(R) changes to the high level VDD, and the sense amplifier enable signal SAE is activated to the high level VDD (FIG. 12(k, l, m)). The replica cell transistors RCT(EV) and RCT(R) are formed using the same manufacturing conditions as those of the real cell transistor CT. Thereby, when a distribution of the cell current flowing through the real cell transistor CT shifts due to a fluctuation in the manufacturing conditions, the distribution of the replica cell current will shift to the same direction. Therefore, in the semiconductor memory chip MEM wherein the cell current is relatively low and the decreasing speed of the voltage of the bit line BL1 is low, the activation timing of the sense amplifier enable signal SAE is also delayed. In the semiconductor memory chip MEM wherein the cell current is relatively high and the decreasing speed of the voltage of the bit line BL1 is high, the activation timing of the sense amplifier enable signal SAE is also quickened. As a result, regardless of the fluctuation of the manufacturing conditions of the semiconductor memory MEM, the activation timing of the sense amplifier enable signal SAE may be always optimally generated.

In this embodiment, the control gate CG and floating gate FG of the replica cell transistors RCT(EV) and RCT(R) are coupled to each other. Therefore, the state of the channel regions of the replica cell transistors RCT(EV) and RCT(R) may be controlled not only by the voltage of the control gate CG but by the voltage of the floating gate FG. When the floating gate FG is not coupled to the control gate CG, the insulator film INS2 and floating gate FG illustrated in FIG. 10 act as a capacitor. Thus, it is difficult to control the state of the channel region by the voltage of the control gate CG. Furthermore, the control gate CG and floating gate FG are short-circuited to each other and therefore even if the semiconductor memory MEM is used for a long time, no charge will be stored in the floating gate FG. From the above, the operation of the replica cell transistors RCT(EV) and RCT(R) may be controlled with accuracy equal to that of the ordinary transistor. In other words, the activation timing of the sense amplifier enable signal SAE may be controlled with a high accuracy.

Due to the activation of the sense amplifier enable signal SAE, the nMOS transistor NM4 illustrated in FIG. 11 couples the amplification transistor NM3 to the global bit line GBL. However, because the amplification transistor NM3 is turned off when it receives at its gate a low level of the bit line BL0, the voltage of the global bit line GBL will not vary (FIG. 12(n)). Subsequently, the latch signal LT is activated to the high level, so that the logic level (VDD) of the data line DT is determined (FIG. 12(o, p)).

In the erase verification operation, it is determined, from the high level VDD of the data line DT, that the threshold voltage of the memory transistor CT to be erased has decreased to an erase state. When the memory cell MC is not in the erase state, the threshold voltage of the memory transistor CT is high and a sufficient cell current will not flow. Hence, as shown by one-dot chain line in FIG. 12(q), the voltage of the bit line BL1 is unlikely to decrease. Thus, the amplification transistor NM3 is turned on, the voltage of the global bit line GBL changes to the low level VSS, and the data line DT is set to the low level VSS. At this time, the erase operation and the erase verification operation are performed again.

After the activation of the latch signal LT, the sense amplifier enable signal SAE and word line WL0 are sequentially inactivated, and the reset signal RST, read signal RD1, and selection signal SECY1 are activated (FIG. 12(r, s)). In response to the inactivation of the reset signal RST, the semiconductor memory MEM enters the standby period STBY, and the operation enable signal EVEN or RDEN is inactivated (FIG. 12(t)). Due to the inactivation of the operation enable signal EVEN or RDEN, the nodes N01(EV), N01(R) change to the high level and the output signals OUT(EV), OUT(R) change to the low level VSS (FIG. 12(u, v)). Then, the erase verification operation or read operation is completed.

Figure 13:
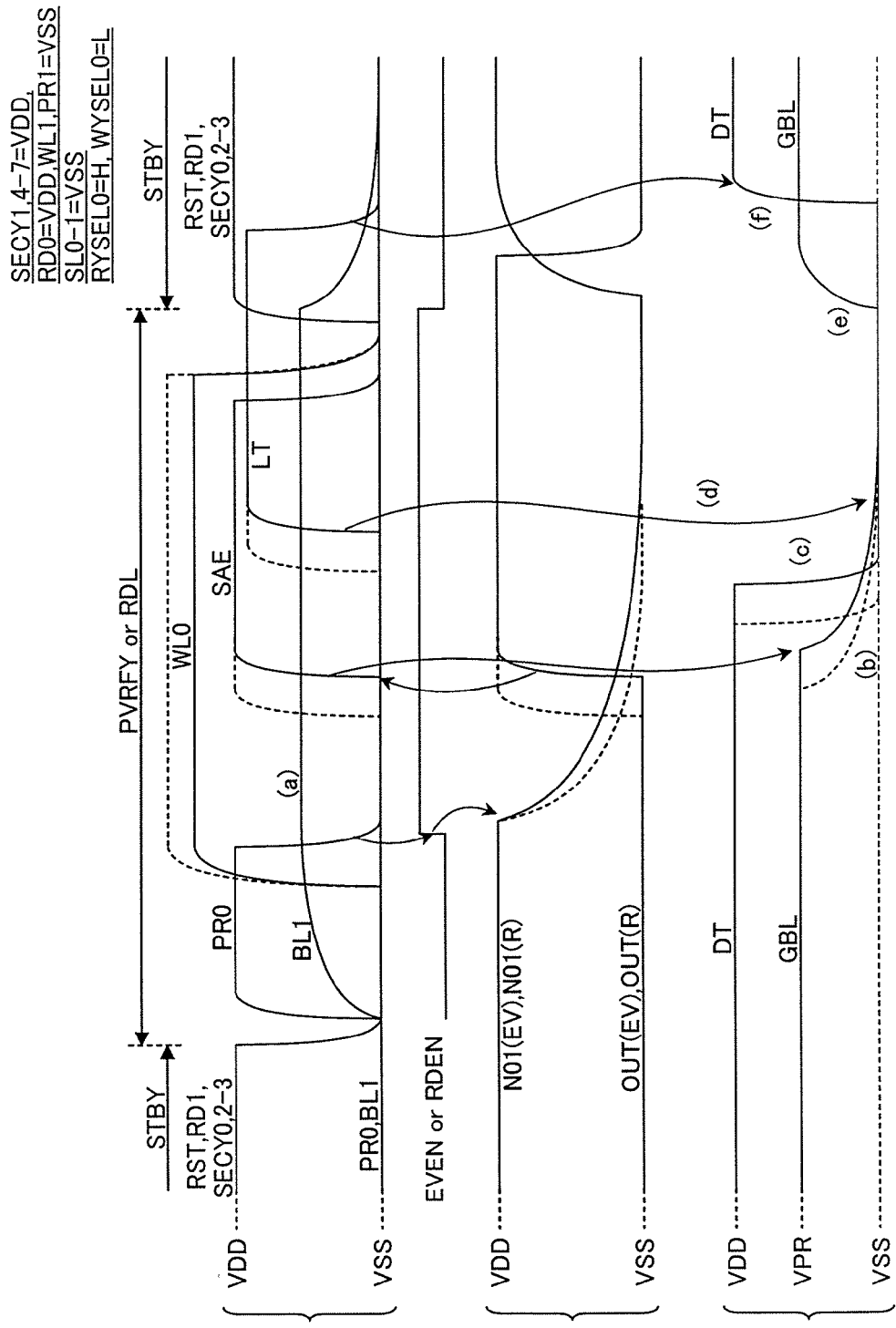
FIG. 13 illustrates an example of a program verification operation and a read operation (logic "0" is read) of the semiconductor memory illustrated in FIG. 2.

FIG. 13 illustrates an example of the program verification operation and the read operation (logic "0" is read) of the semiconductor memory illustrated in FIG. 2. For the same operation as that of FIG. 12, the detailed description is omitted. When the waveform of the program verification operation differs from that of the read operation, the waveform of the read operation is shown by a dotted line. In FIG. 13, as in FIG. 12, the memory cell MC coupled to the word line WL0 and bit line BL1 of the sector SEC0 is accessed. The waveforms other than the waveforms of the bit line BL1, global bit line GBL, and data line DT are the same as those of FIG. 12.

In the program verification operation and the read operation of the logic "0", the threshold voltage of the real cell transistor CT to be accessed is high. Accordingly, the cell current will not flow and the bit line BL1 is held at a precharge voltage (FIG. 13(a)). The amplification transistor NM3 (i.e., sense amplifier SA) illustrated in FIG. 11 receives the high level of the bit line BL1. Therefore, upon activation of the sense amplifier enable signal SAE, the global bit line GBL is coupled to the ground line VSS and changes to the low level (FIG. 13(b)). The buffer circuit BUF illustrated in FIG. 11 outputs the low level to the data line DT in response to a change of the global bit line GBL to the low level (FIG. 13(c)). Then, the low level of the global bit line GBL is latched in synchronization with the latch signal LT (FIG. 13(d)).

Subsequently, in response to the activation of the reset signal RST, the precharge signal PREX illustrated in FIG. 11 is activated to the low level and the global bit line GBL is set to the precharge voltage VPR in the standby period STBY (FIG. 13(e)). In response to the inactivation of the latch signal LT, the buffer circuit BUF captures the low level of the global bit line GBL and outputs the high level to the data line DT (FIG. 13(f)).

Figure 14:
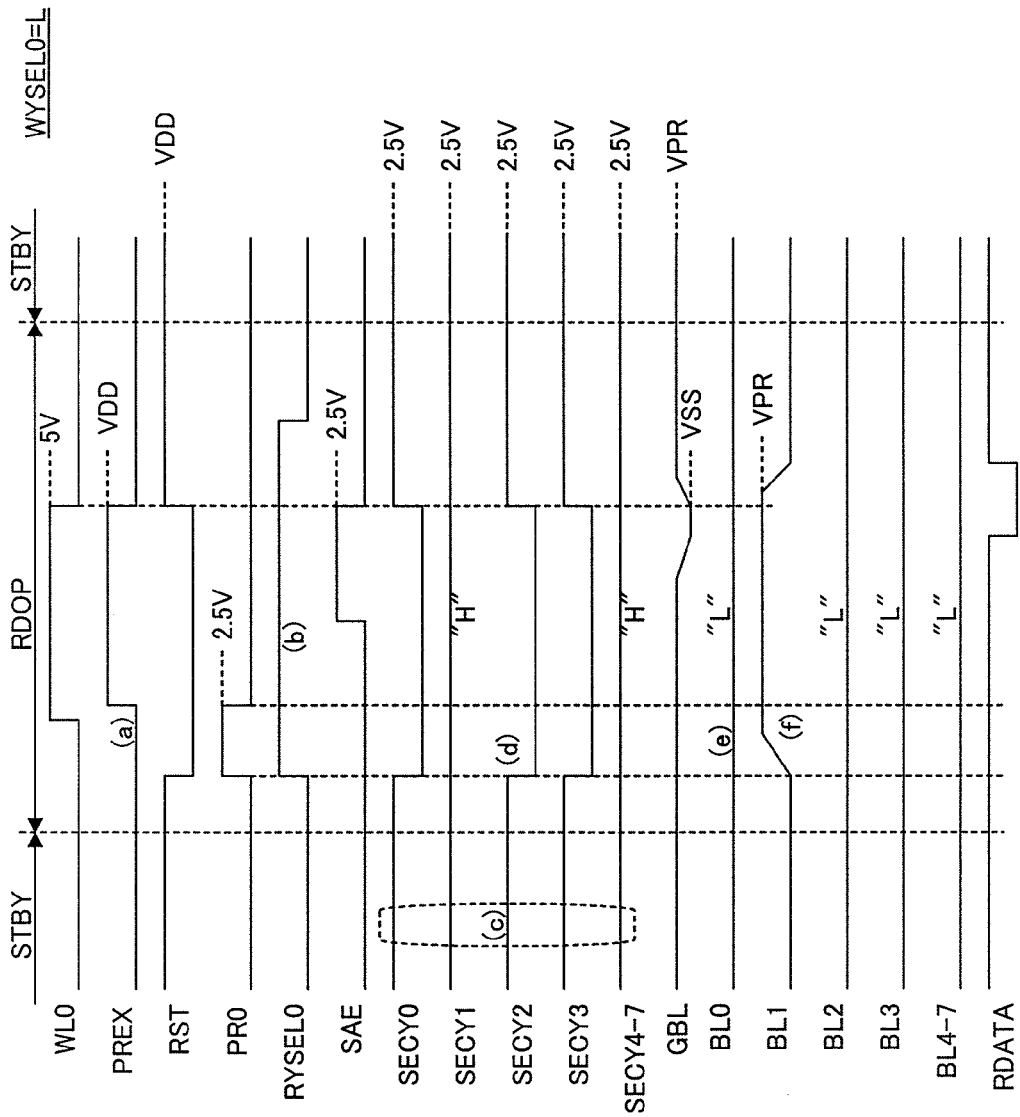
FIG. 14 illustrates an example of a read operation of the semiconductor memory illustrated in FIG. 2.

FIG. 14 illustrates an example of a read operation RDOP of the semiconductor memory MEM illustrated in FIG. 2. Here, the read operation RDOP includes not only the read operation associated with the read command but the program verification operation at the time of program operation and the erase verification operation at the time of erase operation. FIG. 14 illustrates the waveforms of the bit lines BL0, BL2-BL7 other than the bit line BL1 which is coupled to the memory cell MC to be accessed, in the read operation illustrated in FIG. 13.

FIG. 14 also illustrates the waveforms of the precharge signal PREX, read column selection signal RYSEL0, and read data RDATA which are not illustrated in FIG. 13. Note that the voltages illustrated in FIG. 14 are an example, and are not limited to these values.

In the read operation RDOP, the precharge signal PREX is inactivated to the high level in response to the activation of the word line WL0, and the connection between the global bit line GBL and the precharge voltage line VPR is released (FIG. 14(a)). The read column selection signal RYSEL0 is activated in response to the inactivation of the reset signal RST and is inactivated after the reset signal RST is activated (FIG. 14(b)). All the selection signals SECY0-SECY7 are activated to a high level in the standby period STBY (FIG. 14(c)). At this time, all the bit lines BL0-BL7 are coupled to the ground line VSS via the selection switch SSW and the common reset switch. Utilizing the selection switch SSW which is used in reading/writing data, the bit lines BL0-BL7 are set to the ground voltage VSS by use of the common reset switch, so that the number of transistors which are formed in the semiconductor memory MEM in order to reset the bit lines BL0-BL7 may be reduced. Thus, the circuit size may be reduced and the chip size of the semiconductor memory MEM may be reduced.

Among the selection signals SECY0-SECY3 corresponding to the memory cell unit MCU including the memory cell MC from which data is read, the selection signals SECY0, SECY2-SECY3 corresponding to the memory cells MC from which data is not read are inactivated in response to the inactivation of the reset signal RST (FIG. 14(d)). Thus, the bit lines BL0, BL2 and BL3 are set to a floating state of a low level (FIG. 14(e)). The inactivation period of the selection signals SECY0, SECY2 and SECY3 is set according to the timing signal generated by the operation control circuit 22 illustrated in FIG. 2.

Subsequently, as in FIG. 13, in response to the activation of the precharge signal PR0, the bit line BL1 is precharged and the read operation is executed (FIG. 14(f)). At this time, the bit lines BL0, BL2 adjacent to the bit line BL1 are maintained at a low level. Because the voltages of the adjacent bit lines BL0, BL2 will not change, the voltage of the bit line BL1 is not influenced by a coupling noise or the like. As a result, it is possible to prevent the semiconductor memory MEM from malfunctioning during the read operation.

Figure 15:
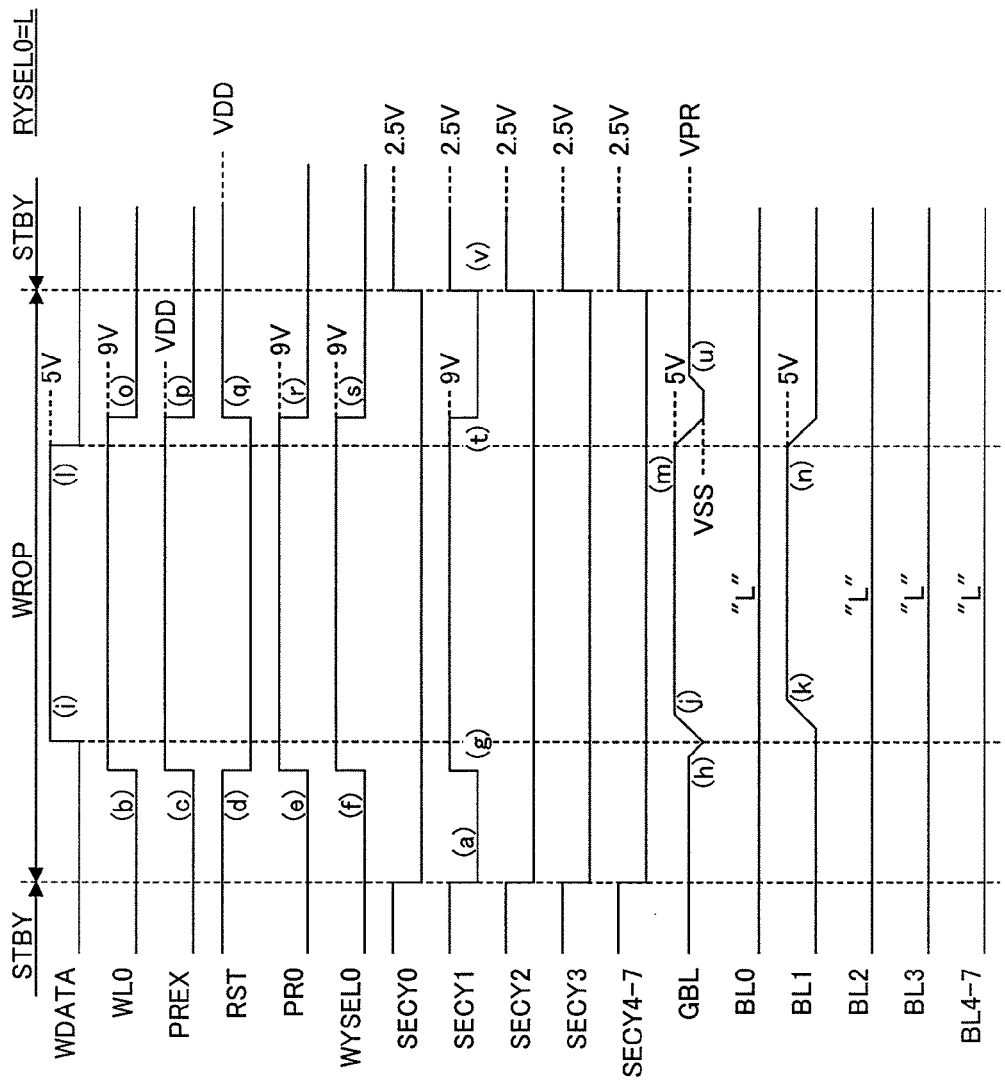
FIG. 15 illustrates an example of a write operation of the semiconductor memory illustrated in FIG. 2.

FIG. 15 illustrates an example of a write operation WROP of the semiconductor memory MEM illustrated in FIG. 2. In this example, as in FIG. 12 to FIG. 14, the memory cell MC coupled to the word line WL0 and bit line BL1 of the sector SEC0 is accessed and the logic "0" is written. Note that the voltages illustrated in FIG. 15 are an example, and is not limited to these values.

In the write operation WROP, first, the selection signals SECY0-SECY7 corresponding to the memory cell unit MCU including the memory cell MC into which data is written are inactivated to a low level (FIG. 15(a)). Next, the word line WL0 is activated, the precharge signal PREX and reset signal RST are inactivated, the precharge signal PR0 is activated, and the write column selection signal WYSEL0 is activated (FIG. 15(b, c, d, e, f)). Furthermore, the selection signal SECY1 corresponding to the memory cell MC into which data is written is activated (FIG. 15(g)).

Here, the precharge signal PR0 is activated in order to transmit the write data on the global bit line GBL to the bit line BL1, and the nMOS transistor receiving the precharge signal PR0 at its gate operates as the write transistor. By the write transistor being turned on, the global bit line GBL is coupled to the bit line BL1 of a low level, and the voltage of the global bit line GBL decreases (FIG. 15(h)).

Next, the write data WDATA is transmitted to the global bit line GBL via the write column switch WCSW and is furthermore transmitted to the bit line BL1 (FIG. 15(i, j, k)). Thus, an electron is injected into the floating gate FG of the cell transistor CT coupled to the bit line BL1, and the threshold voltage of the cell transistor CT increases. That is, the logic "0" is written.

Subsequently, the supply of write data from the write amplifier WA is stopped, and the voltages of the global bit line GBL and bit line BL1 decrease (FIG. 15(l, m, n)). Next, the word line WL0 is inactivated, the precharge signal PREX and reset signal RST are activated, the precharge signal PR0 is inactivated, the write column selection signal WYSEL0 is inactivated, and the selection signal SECY1 is inactivated (FIG. 15(o, p, q, r, s, t)). Due to the activation of the precharge signal PREX, the global bit line GBL is set to the precharge voltage VPR (FIG. 15(u)). Subsequently, the selection signals SECY0-SECY7 are activated, the bit lines BL0-BL7 are reset to a low level, and the write operation WROP is completed (FIG. 15(v)).

As a result, also in this embodiment, the same effect as that of the above-described embodiment may be obtained. Furthermore, the replica cell transistor RCT is formed in the replica unit REP in which the same devices as those of the memory cell array 32 are formed, so that the tendency of the fluctuation in the electric characteristic of the real cell transistor CT may be made the same as the tendency of the fluctuation in the replica cell transistor RCT. By coupling the floating gate FG to the control gate CG at a place away from the replica cell transistor RCT, the electric characteristic of the replica cell transistor RCT may be made substantially the same as that of the real cell transistor CT.

Because the capacitance of the capacitor C1 formed in the timing generation unit TGEN is matched with the load capacitance of the bit line BL, the decreasing speed of the voltage of the node ND01 may be matched with the decreasing speed of the voltage of the bit line BL. Because the precharge voltage of the node N01 is set to the power supply voltage VDD, the sense amplifier enable signal SAE may be generated without interposing a level shifter.

The operation to reset the bit lines BL0-BL7 to the ground voltage VSS is performed using the common reset switch and the selection switch SSW which is used in reading/writing data, so that the number of transistors formed in the semiconductor memory MEM may be reduced and the chip size of the semiconductor memory MEM may be reduced.

Figure 16:
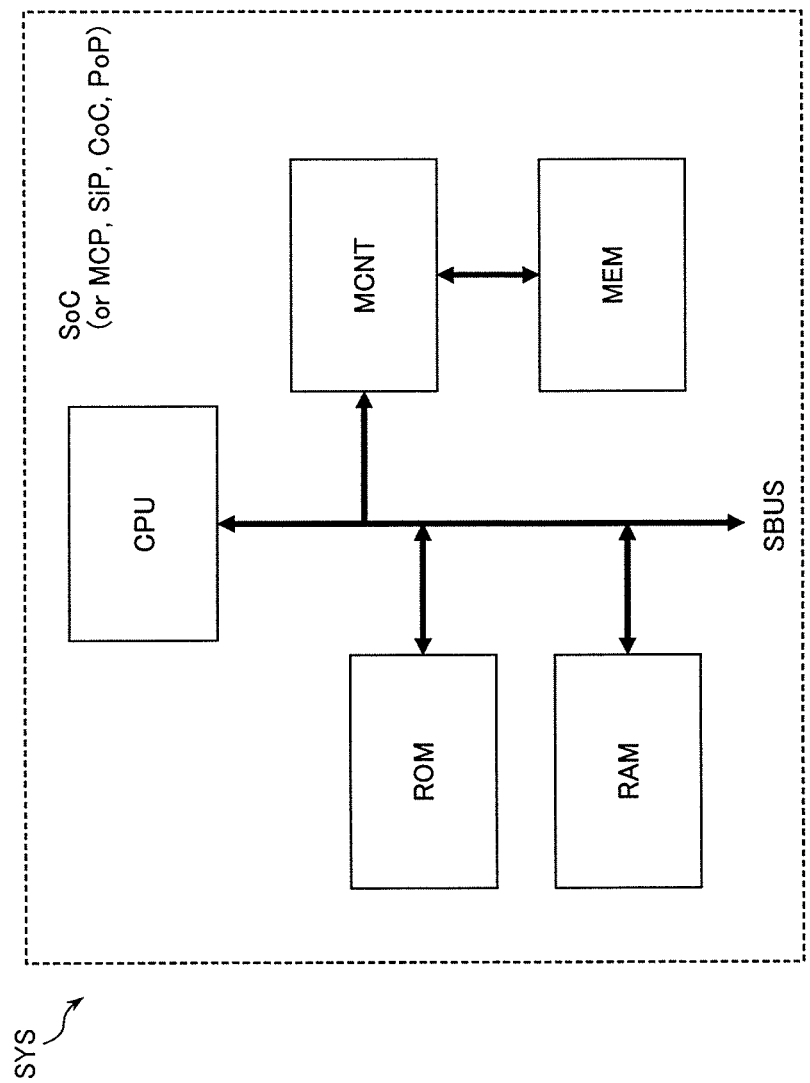
FIG. 16 illustrates an example of a system on which the above-described semiconductor memory is mounted.

FIG. 16 illustrates an example of a system in which the above-described semiconductor memory MEM is mounted. A system SYS (user system) constitutes at least a part of a microcomputer system of, for example, a portable equipment or the like. The system SYS includes a System-on-Chip SoC having a plurality of macros integrated on a silicon substrate. Alternatively, the system SYS includes a Multi-Chip-Package MCP having a plurality of chips stacked above a package board. Alternatively, the system SYS includes a System-in-Package SiP having a plurality of chips mounted above a package board, such as a lead frame. Furthermore, the system SYS may be formed in the form of Chip-on-Chip CoC or Package-on-Package PoP.

For example, the system SYS includes a CPU, a ROM, a RAM, a memory control circuit MCNT, and the semiconductor memory MEM illustrated in FIG. 1 or FIG. 2. The CPU, ROM, RAM, and memory control circuit MCNT are coupled to each other by a system bus SBUS. The memory control circuit MCNT and the semiconductor memory MEM are coupled to each other by a dedicated bus. Note that, the CPU may have the function of the memory control circuit MCNT, so that the semiconductor memory MEM may be directly accessed by the CPU without via the memory control circuit MCNT.

The CPU accesses the ROM and RAM and also accesses the semiconductor memory MEM via the memory control circuit MCNT to control the whole system operation. The semiconductor memory MEM executes the write operation, read operation, and erase operation according to an access request from the memory control circuit MCNT which operates in accordance with an instruction from the CPU.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor memory, comprising:
   a plurality of nonvolatile memory cells including cell transistors each including a control gate, a floating gate, a drain and a source;
   a replica cell transistor comprising a replica control gate, a replica floating gate, a replica drain, and a replica source;
   a plurality of bit lines coupled to the respective drains of the cell transistors;
   a word line commonly coupled to the control gates of the cell transistors;
   a source line commonly coupled to the sources of the cell transistors;
   a plurality of selection switches coupled to the respective bit lines, and configured to couple the bit lines to a common node;
   an operation control circuit including a timing generation circuit configured to generate a plurality of operation control signals including a precharge signal, a sense amplifier enable signal and a reset signal, wherein a level of the sense amplifier enable signal depends on an electric characteristic of the replica cell transistor;
   a precharge switch configured to couple the common node to a precharge line, the precharge switch being activated by the precharge signal;
   a sense amplifier configured to determine logic of data which is read from each of the nonvolatile memory cells to the common node via each of the bit lines, the sense amplifier being activated by the sense amplifier enable signal; and
   a reset switch configured to couple the common node to a ground line, the reset switch being activated by the reset signal.

2. The semiconductor memory according to claim 1, wherein all the selection switches and the reset switch are turned on in a standby period, and
   wherein the operation control circuit, in a write operation, turns off the reset switch after turning off all the selection switches, and, in order to write write-data supplied to the common node into one of the nonvolatile memory cells, turns on a selection switch corresponding to the one of the nonvolatile memory cells into which data is written.

3. The semiconductor memory according to claim 1, further comprising:
   a voltage generation circuit configured to generate a plurality of control voltages-supplied to the timing generation circuit, wherein the timing generation circuit sets activation periods of the plurality of operation control signals based on the control voltages.

4. The semiconductor memory according to claim 3, further comprising:
   a test mode control circuit configured to output a plurality of test control signals to the voltage generation circuit such that the voltage generation circuit generates an improved set of control voltages.

5. The semiconductor memory according to claim 1, further comprising:
   an address selection circuit configured to output a row address signal to a row control circuit and a column address signal to a column control circuit,
       wherein the row control circuit is configured to set the word line and the source line to a predetermined voltage, respectively, based on the row address signal and at least one of the operation control signals, and
       wherein the column control circuit is configured to generate selection signals to control the selection switches based on the column address signal and at least one of the operation control signals.

6. The semiconductor memory according to claim 1, wherein the operation control circuit, in a read operation, turns of at least one of selection switches corresponding to at least one of the plurality of nonvolatile memory cells from which data is not read, among all the selection switches being turned-on, turns of the reset switch, and turns on the precharge switch to activate the word line.

7. The semiconductor memory according to claim 1, wherein the replica floating gate is conductively coupled to the replica control gate.

8. The semiconductor memory according to claim 1, wherein the replica floating gate is short-circuited to the replica control gate.

* * * * *